(12) United States Patent
Iijima et al.

(10) Patent No.: US 7,238,603 B2
(45) Date of Patent: Jul. 3, 2007

(54) CONNECTING MEMBER BETWEEN WIRING FILMS, MANUFACTURING METHOD THEREOF, AND MANUFACTURING METHOD OF MULTILAYER WIRING SUBSTRATE

(75) Inventors: Tomoo Iijima, Tokyo (JP); Kimitaka Endo, Tokyo (JP)

(73) Assignee: Tessera Interconnect Materials, Inc., San Jose, CA (US)

( * ) Notice: Subject to any disclaimer, the term of this patent is extended or adjusted under 35 U.S.C. 154(b) by 0 days.

(21) Appl. No.: 11/029,423

(22) Filed: Jan. 6, 2005

(65) Prior Publication Data
US 2005/0161804 A1    Jul. 28, 2005

Related U.S. Application Data

(62) Division of application No. 10/358,229, filed on Feb. 5, 2003, now Pat. No. 6,884,709.

(30) Foreign Application Priority Data

Feb. 18, 2002 (JP) ............... 2002-39414
Aug. 9, 2002 (JP) ............... 2002-233778

(51) Int. Cl.
*H01L 21/44* (2006.01)

(52) U.S. Cl. ............ 438/613; 174/255; 361/795; 438/614

(58) Field of Classification Search ............ 438/690, 438/700, 701–702, 613–614, 617, 108, 118, 438/115; 174/265, 255
See application file for complete search history.

(56) References Cited

U.S. PATENT DOCUMENTS

| 5,135,606 | A | 8/1992 | Kato et al. ............... 156/631 |
|---|---|---|---|
| 5,600,103 | A * | 2/1997 | Odaira et al. ............... 174/265 |
| 5,822,850 | A | 10/1998 | Odaira et al. ............... 29/846 |
| 5,865,934 | A * | 2/1999 | Yamamoto et al. ......... 156/295 |
| 5,915,753 | A | 6/1999 | Motomura et al. ........... 29/830 |
| 6,204,089 | B1 * | 3/2001 | Wang ........................ 438/108 |
| 6,237,218 | B1 * | 5/2001 | Ogawa et al. ............... 29/830 |
| 6,262,376 | B1 | 7/2001 | Hurwitz et al. |
| 6,262,478 | B1 | 7/2001 | Hurwitz et al. |
| 6,280,640 | B1 | 8/2001 | Hurwitz et al. |
| 6,329,610 | B1 * | 12/2001 | Takubo et al. ............... 174/264 |
| 6,589,870 | B1 | 7/2003 | Katoh ........................ 438/690 |
| 6,601,297 | B1 | 8/2003 | Schmidt ...................... 29/852 |
| 6,684,497 | B2 | 2/2004 | Appelt et al. ................ 29/852 |
| 6,705,003 | B2 | 3/2004 | Motomura et al. ........... 29/830 |
| 6,709,966 | B1 | 3/2004 | Hisatsune et al. .......... 438/613 |
| 6,872,893 | B2 * | 3/2005 | Fukuoka et al. ............. 174/255 |
| 2001/0040794 | A1 | 11/2001 | Shimizu et al. ............. 361/749 |

FOREIGN PATENT DOCUMENTS

| JP | 52-12458 | 8/1993 |
|---|---|---|
| JP | 408139450 | 5/1996 |
| JP | 408195561 | 7/1996 |
| JP | 409162553 | 6/1997 |
| JP | 11-298105 | 10/1999 |
| JP | 2001-326458 | 11/2001 |

\* cited by examiner

*Primary Examiner*—Thao X. Le
(74) *Attorney, Agent, or Firm*—Lerner, David, Littenberg, Krumholz & Mentlik, LLP

(57) ABSTRACT

A connecting member between wiring films is provided in which: a normal copper foil, which is a general-purpose component and not expensive, or the like can be used as a material; formation of bumps is sufficiently achieved by conducting etching one time; and a necessary number of layers can be laminated and pressed collectively at a time. Bumps, which are formed approximately in a cone-shape, for connecting wiring films of a multilayer wiring substrate are embedded in a second resin film that serves as an interlayer insulating film.

8 Claims, 18 Drawing Sheets

Fig. 1 (F) 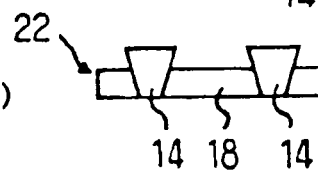 Fig. 1 (F') 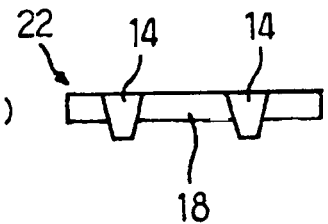

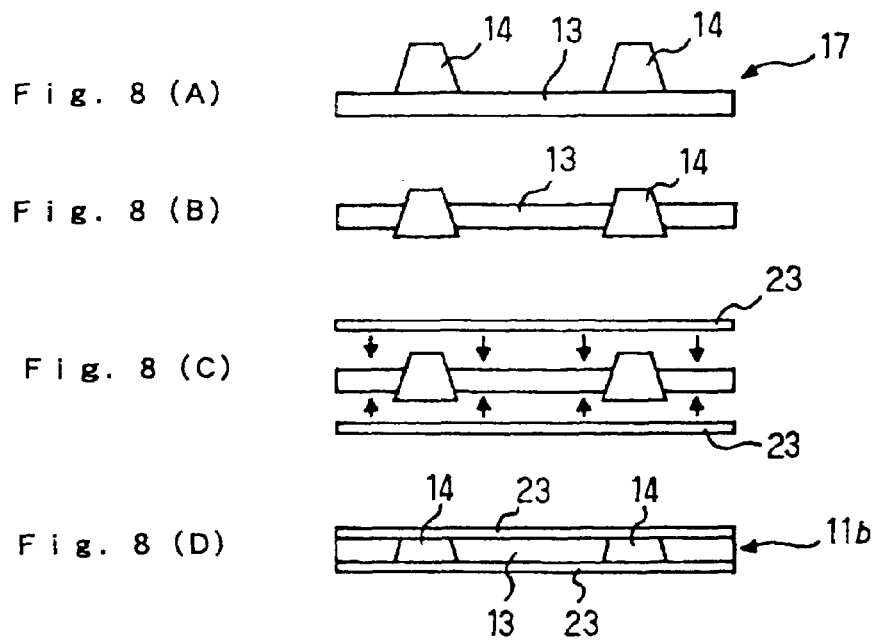
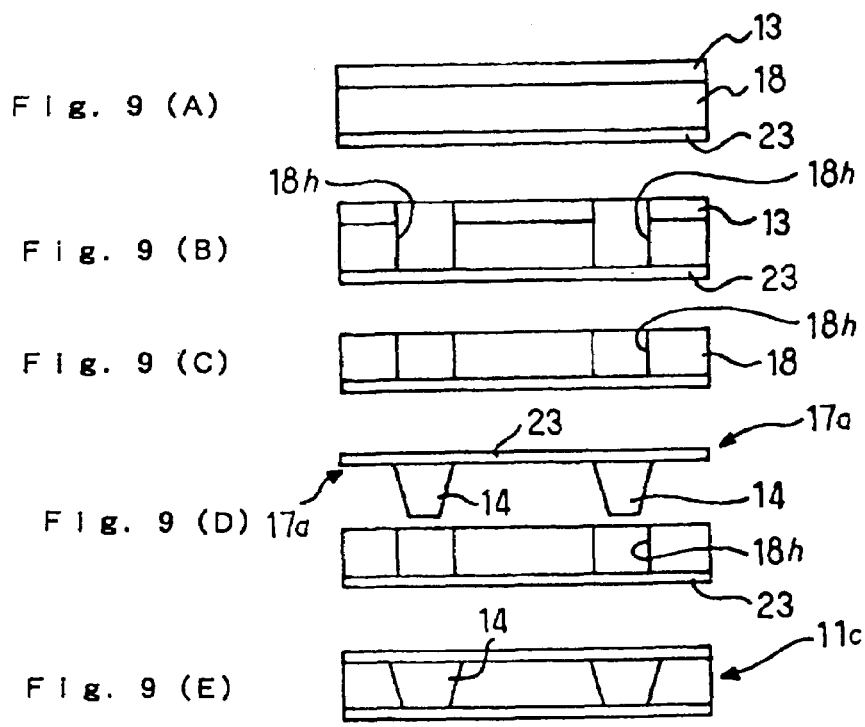

Fig. 1 5 (A)
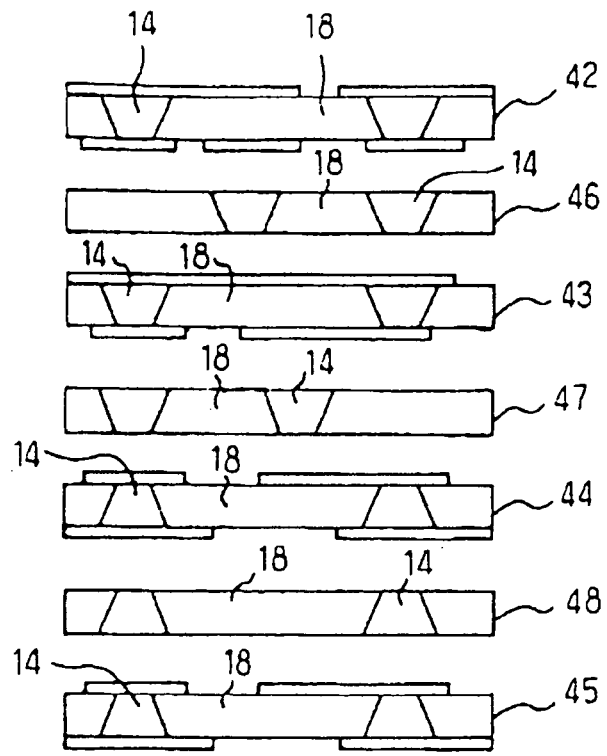
Fig. 1 5 (B)
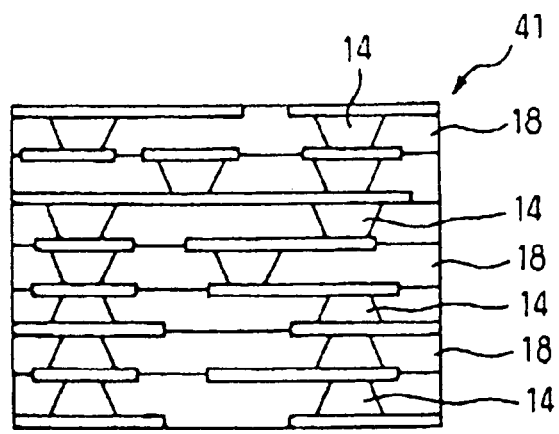

Fig. 2 2 (A) 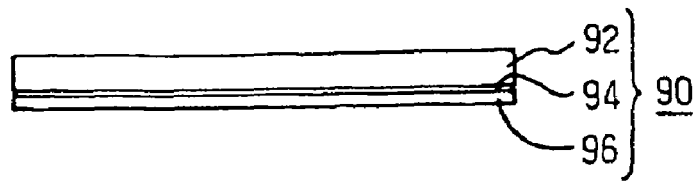
Fig. 2 2 (B) 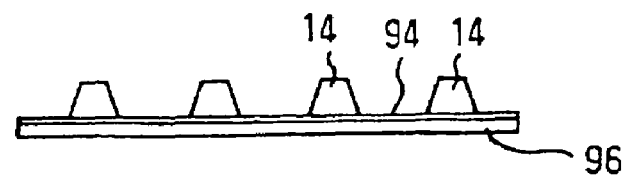
Fig. 2 2 (C) 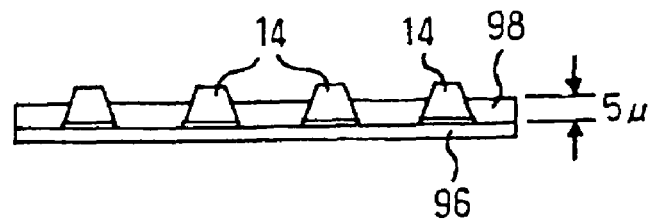
Fig. 2 2 (D) 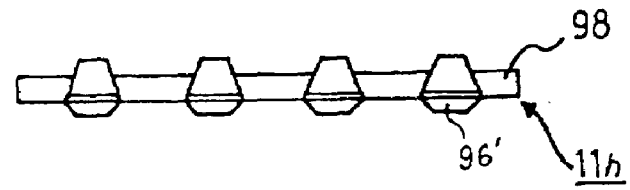
Fig. 2 3
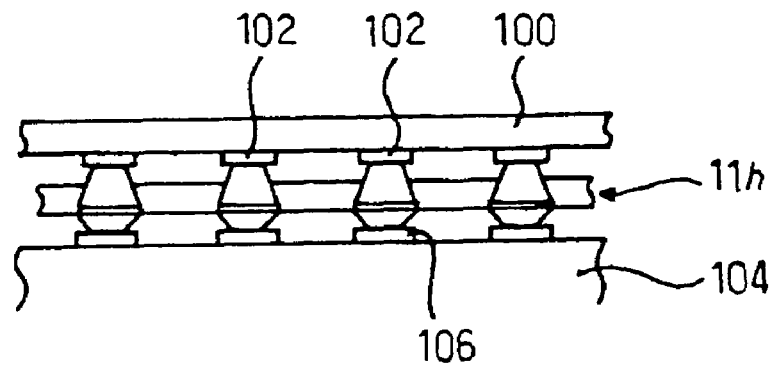

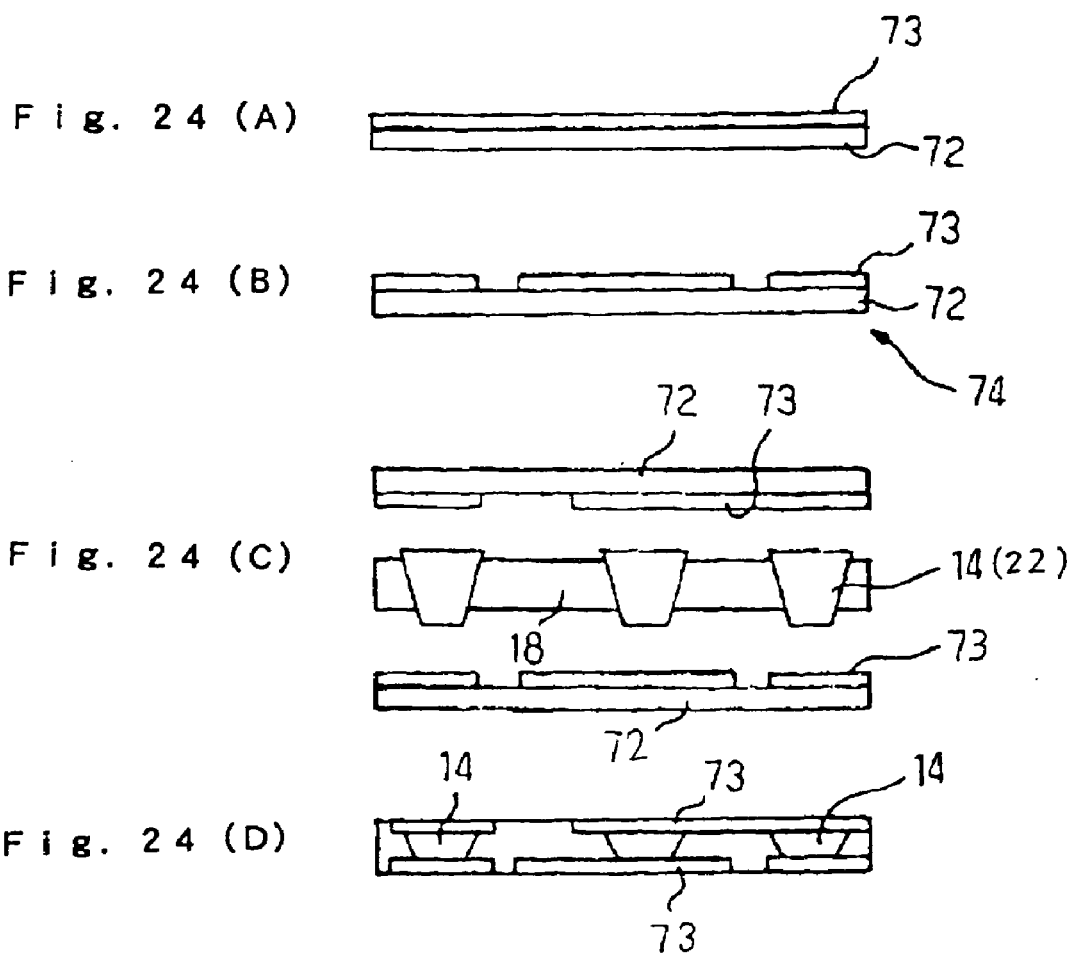

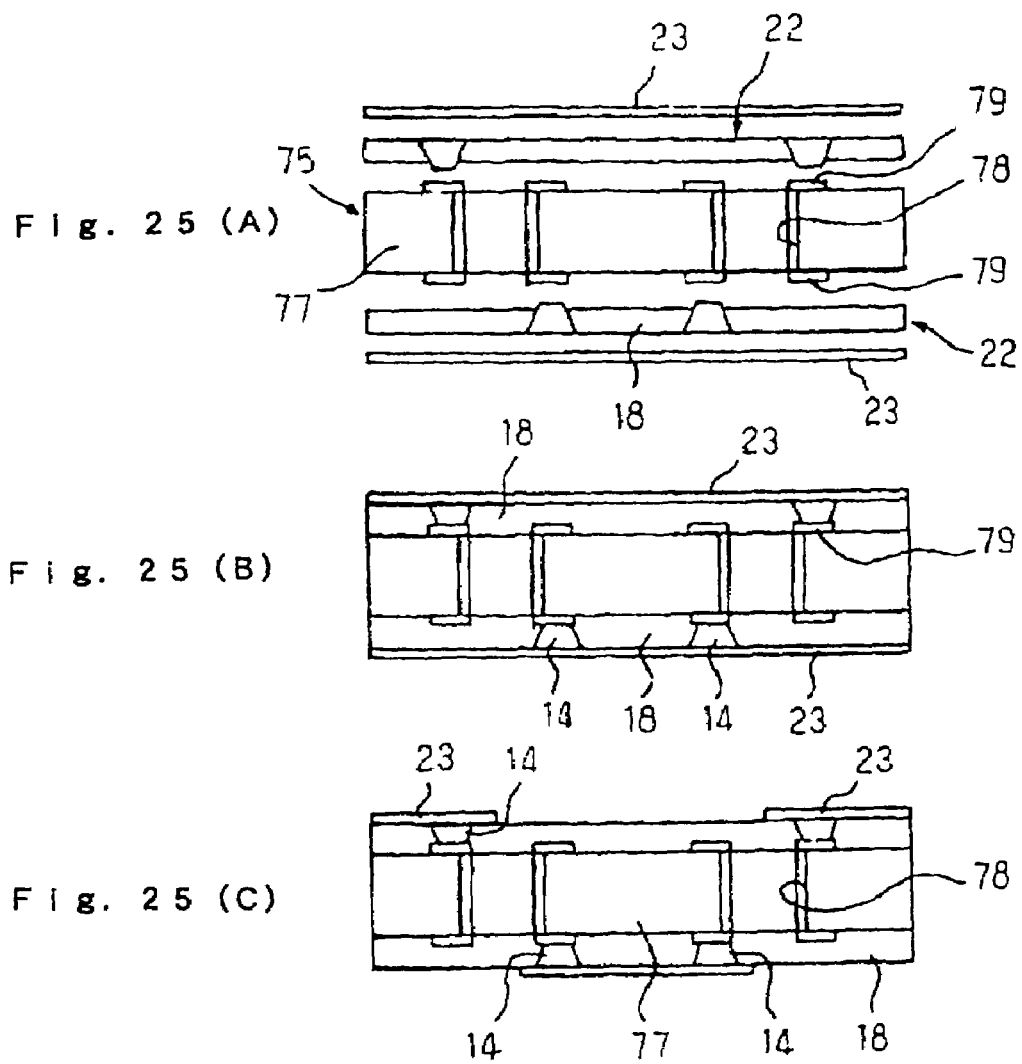

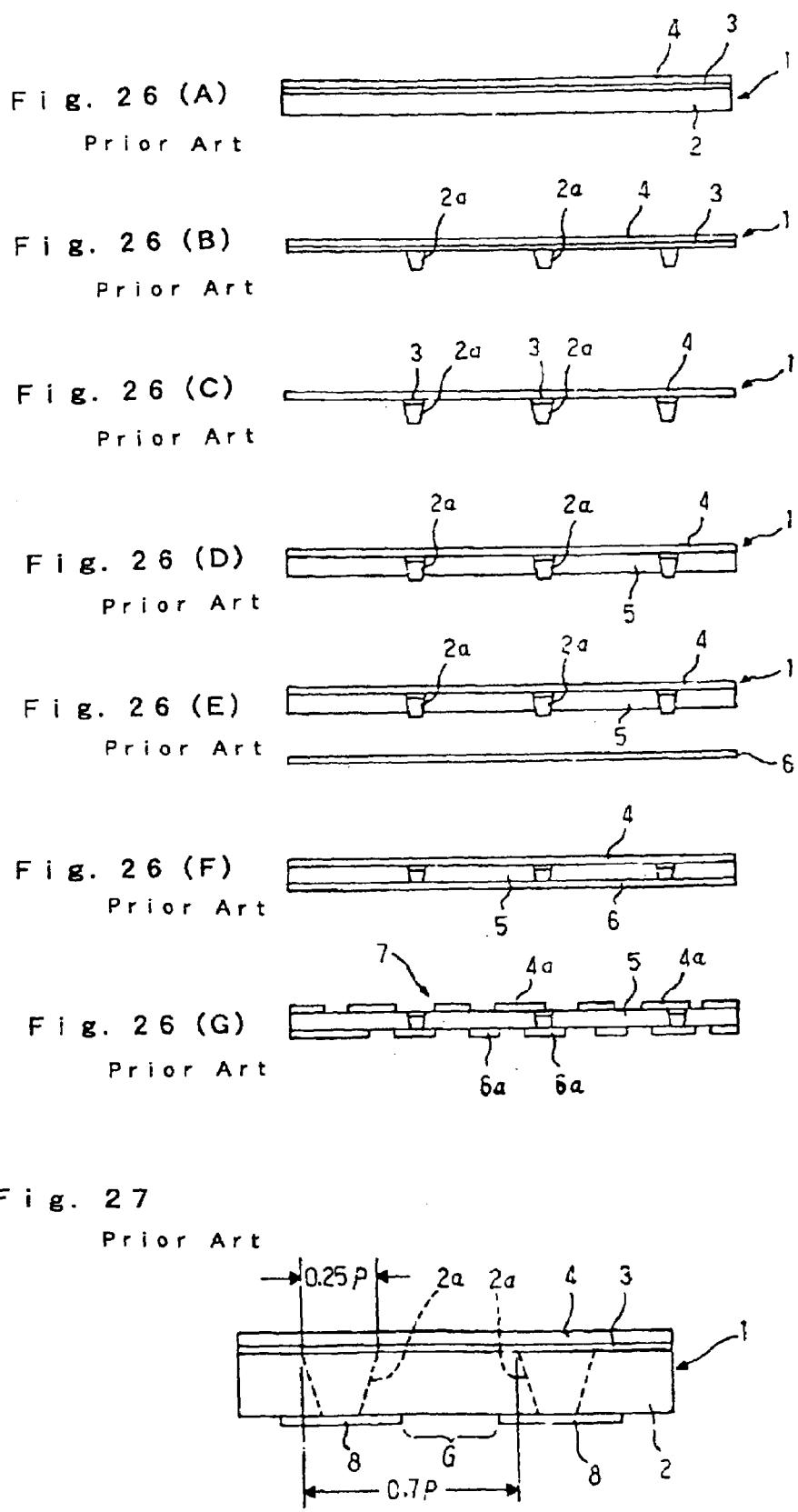

CONNECTING MEMBER BETWEEN WIRING FILMS, MANUFACTURING METHOD THEREOF, AND MANUFACTURING METHOD OF MULTILAYER WIRING SUBSTRATE

This application is a divisional application of Ser. No. 10/358,229, filed Feb. 5, 2003 now U.S. Pat. No. 6,884,709.

BACKGROUND OF THE INVENTION

1. Field of the Invention

The present invention relates to a connecting member between wiring films, a manufacturing method thereof, and a manufacturing method of a multilayer wiring substrate, and specifically, to a connecting member between wiring films, a manufacturing method thereof, and a manufacturing method of a multilayer wiring substrate which are preferably applied to the case where the connecting between wiring films of the multilayer wiring substrate is performed by using a bump made of copper, for example.

2. Description of the Related Art

As one of the methods of performing the connecting between wiring films of a multilayer wiring substrate, there is a method of using a bump made of copper, for example. The method will be simply described with reference to FIG. 26.

A. First, a multilayer metal plate 1 is prepared as shown in FIG. 26(A). The multilayer metal plate 1 is formed by laminating a wiring film forming metal layer 4 that is made of copper foil having a thickness of, for example, 18 μm, through an etching stopping layer 3 that is made of nickel having a thickness of, for example, 1 μm, on one of principal surfaces of a bump forming metal layer 2 that is made of copper foil having a thickness of, for example, 100 μm.

B. The bump forming metal layer 2 of the multilayer metal plate 1 is subjected to selective etching to form bumps 2a for connecting between the wiring films, as shown in FIG. 26(B).

C. When the etching treatment is completed, as shown in FIG. 26(C), an etching treatment with respect to the etching stopping layer 3 is conducted by using copper as a mask, copper being used in forming the bumps 2a and the wiring film forming metal layer 4.

D. An insulating film 5 made of, for example, thermosetting resin is then bonded to the formed surface of the bump 2a so as to expose the top portion of the bump 2a, as shown in FIG. 26(D).

E. Thereafter, a wiring film forming metal thin plate 6 made of, for example, copper is provided so as to face a surface of the multilayer metal plate 1 from which the top portion of the bump 2a is projected, as shown in FIG. 26(E).

F. The wiring film forming metal thin plate 6 is connected to the bump 2a to be laminated on the formed surface side of the bump 2a, as shown in FIG. 26(F).

G. The wiring film forming metal layer 4 of the multilayer metal plate 1 and the wiring film forming metal thin plate 6 are subjected to patterning treatment by selective etching, to thereby form wiring films 4a and 6a. Thus, a multilayer wiring substrate 7 is completed as shown in FIG. 26(G). The wiring films 4a become the wiring films of the upper layer, and the wiring films 6a become the wiring films of the lower layer. When the number of layers is further increased, a wiring substrate in the state shown in FIG. 26(D) is laminated on the multilayer wiring substrate 7, for example.

In the above-described conventional technique, the multilayer metal plate 1 is employed. As described above, the multilayer metal plate 1 has the three-layer structure made of, for example, a copper layer, a nickel layer and a copper layer. The multilayer metal plate 1 is not a general-purpose component such as a simple copper foil but a custom-made component. Therefore, the unit price is expensive.

Also, in the above-described conventional technique, the bumps 2a are formed by first etching, and the removal of the etching stopping layer 3 is performed by second etching. Thus, it is necessary that the different kinds of etching are performed at least twice. Therefore, the number of steps for the processes is increased, and the etching material cost is also increased since different materials are used for selective etching.

In the above-described conventional technique, when the number of the layers is increased, it is necessary to repeat the steps of, for example, forming the wiring films 4a on the wiring film forming metal layer 4 by etching, to laminate the wiring substrate in the state shown in FIG. 26(D) thereon; and forming the next wiring films 4a on the wiring film forming metal layer 4 by etching, to laminate the next wiring substrate in the state shown in FIG. 26(D) thereon. Therefore, it is impossible to stack a desired number of layers at a time to press them collectively.

Also, in the above-described conventional technique, etching resist patterns 8 corresponding to the bumps are formed on the bump forming metal layer 2 and the etching is conducted by using the patterns 8 as the masks, to thereby form the bumps 2a, as shown in FIG. 27. However, in this case, the diameter of each of the etching resist patterns 8 is not allowed to be set to a value equal to or smaller than a given value in relation to the depth of the etching. Also, it is necessary to provide gaps G having the distance equal to or larger than a given value between the etching resist patterns 8. Therefore, the pitch of the etching resist pattern 8, in other words, the pitch of the bump 2a, is not allowed to be set to a value smaller than a given value. For example, when the metal layer has a thickness of 0.1 mm, the pitch has a limitation of 0.4 mmP (Here, foot portion of the bump has a diameter of 0.15 mm.)

In the above-described conventional technique, the wiring film forming metal layer 4 is necessary to have the thickness capable of resisting the conveyance with a conveyor in order to support the bumps 2a to be formed. The metal layer 4 having an extremely thin thickness causes wrinkles, scars, and breaks in the process, and thus, can not be substantially adopted. The step that adopts the semi-additive process that enables minuteness compared with a subtracting process is convenient as long as metal foils with a thickness of about 3 to 5 μm can be used on both sides of the insulating film 5. However, with the above reason, it is difficult to form the wiring layers with a thickness of about 3 to 5 μm.

Also, in the above-described conventional technique, when the bump 2a is heightened, the diameter of a so-called foot portion of the bump 2a is also inevitably increased. Therefore, in the state where the bump 2a is heightened, it is impossible to set a pitch of the bump 2a to a value equal to or smaller than a certain degree.

SUMMARY OF THE INVENTION

The present invention has been made to solve the above-described defects in the conventional technique and has an object to provide a connecting member between wiring films, a manufacturing method thereof, and a manufacturing method of a multilayer wiring substrate, in which a necessary number of layers can be laminated and pressed collectively at a time, bumps can be arranged with a pitch smaller than the limitation pitch of an etching resist pattern, fine wiring patterns can be formed by a semi-additive process on both sides of an insulating film, or a fine pitch can be maintained even when a bump is heightened.

According to a first aspect of the present invention, there is provided a connecting member between wiring films, characterized in that a plurality of bumps, which are made of copper or copper alloy and are formed approximately in a cone-shape, for connecting wiring films of a multilayer wiring substrate are embedded in an insulating film such that at least one ends of the bumps are projected therefrom.

According to a second aspect of the present invention, in the first aspect of the invention, there is provided the connecting member between wiring films, characterized in that the insulating film is comprised of a resin layer with a three-layer structure in which thermo-compression bonding resin is provided to both surfaces of a core member made of resin.

According to a third aspect of the present invention, there is provided a method of manufacturing a connecting member between wiring films, characterized by comprising:
  laminating a carrier layer on a bump forming metal layer;
  forming resist patterns to an opposite surface of the bump forming metal layer to the surface on which the carrier layer is laminated;
  performing etching to the bump forming metal layer with the resist patterns serving as a mask to form a first member in which a plurality of bumps, which are formed approximately in a cone-shape, are projected from the carrier layer;
  laminating an insulating film on the first member so as to make top portions of the bumps be exposed from the insulating film to form a second member; and
  removing the carrier layer from the second member to form a connecting member between wiring films in which the bumps formed approximately in a cone-shape are embedded in the insulating film such that at least one ends of the bumps are projected therefrom.

According to a fourth aspect of the present invention, there is provided a method of manufacturing a multilayer wiring substrate, characterized by comprising:
  arranging copper foils that serve as wiring films above and under a connecting member between wiring films having a plurality of bumps which are formed approximately in a cone-shape and which are embedded in an insulating film such that at least one ends of the bumps are projected therefrom; and
  integrating the insulating film and the copper foils through thermal pressing.

According to a fifth aspect of the present invention, there is provided the method of manufacturing a multilayer wiring substrate, characterized by comprising:
  arranging members in which a metal foil is previously attached to a carrier layer and predetermined patterning is conducted thereto above and under a connecting member between wiring films having a plurality of bumps which are formed approximately in a cone-shape and which are embedded in an insulating film such that at least one ends of the bumps are projected therefrom; and
  integrating the insulating film, the bumps, the carrier layer, and the metal foil through thermal pressing.

According to a sixth aspect of the present invention, there is provided the method of manufacturing a multilayer wiring substrate, characterized by comprising connecting wiring films of a double-sided wiring substrate or multilayer wiring substrate with wiring films of other double-sided wiring substrate or multilayer wiring substrate by a plurality of bumps which are formed approximately in a cone-shape and which are embedded in an insulating film such that at least one ends of the bumps are projected therefrom.

According to a seventh aspect of the present invention, there is provided the method of manufacturing a multilayer wiring substrate, characterized by comprising:
  preparing a member in which a plurality of bumps formed approximately in a cone-shape are formed on one of principal surfaces of a carrier layer;
  laminating an insulating film for interlayer insulation on the one of principal surfaces of the carrier layer so as to make the insulating film be penetrated with the bumps;
  laminating a wiring film forming metal foil on an opposite surface of the insulating film to the carrier layer;
  removing the carrier layer; and
  laminating other wiring film forming metal foil, which is different from the wiring film forming metal foil, on the surface of the insulating film from which the carrier layer is removed to integrate the bumps, the insulating film, and the two wiring film forming metal foils.

According to an eighth aspect of the present invention, there is provided a method of manufacturing a multilayer wiring substrate, characterized by comprising:
  preparing a member in which a plurality of bumps formed approximately in a cone-shape are formed on one of principal surfaces of a carrier layer that serves as an interlayer insulating film;
  obtaining a state where the bumps penetrate the carrier layer; and
  laminating wiring film forming metal foils on both surfaces of the carrier layer to integrate the carrier, the bumps, and the two wiring film forming metal foils.

According to a ninth aspect of the present invention, there is provided the method of manufacturing a multilayer wiring substrate, characterized by comprising:
  preparing a member in which a plurality of bumps are formed on one of principal surfaces of a wiring film forming metal foil and other member in which an insulating film for interlayer insulation is laminated on one of principal surfaces of other wiring film forming metal foil and a plurality of bump corresponding holes are formed in the insulating film so as to correspond to the plurality of bumps; and
  performing alignment and lamination of the two members so as to make the respective bumps of the member correspond to the respective bump corresponding holes of the other member to integrate the bumps, the insulating film, and the two wiring film forming metal foils.

According to a tenth aspect of the present invention, there is provided the method of manufacturing a multilayer wiring substrate, characterized by comprising:
  preparing a member in which a plurality of bumps are formed on one of principal surfaces of a mold and other member in which other mold is laminated on one of principal surfaces of an insulating film for interlayer insulation and bump corresponding holes are formed on the other mold so as to correspond to the bumps;
  facing the insulating film of the other member toward the surface of the member formed with the bumps on the side on which the bumps are formed so as to align the bump corresponding holes and the corresponding bumps with each other in position;
  pressurizing the two molds so as to make the insulating film be penetrated with the bumps; and
  removing the two molds and then laminating wiring film forming metal foils on both the surfaces of the insulating film to integrate the insulating film, the bumps, and the two wiring film forming metal foils.

According to an eleventh aspect of the present invention, in the tenth aspect of the invention, there is provided the method of manufacturing a multilayer wiring substrate, characterized in that:

the mold adhered with a resin film with adhesive by the adhesive on its opposite surface to the insulating film is used as the mold formed with the bump corresponding holes; and a pressurizing force is applied to the two molds so as to make the insulating film be penetrated with the bumps, and then, in removing the two molds, the mold having the bump corresponding holes is removed through the adhesive by peeling the resin film.

According to a twelfth aspect of the present invention, there is provided the method of manufacturing a multilayer wiring substrate, characterized by comprising:

performing half etching from one of principal surfaces of a bump forming metal foil to form a plurality of half bumps;

laminating an insulating film for interlayer insulation on the one of principal surfaces of the bump forming metal foil so as to make the insulating film be penetrated with the half bumps;

laminating a wiring film forming metal foil connected with the half bumps on a surface of the insulating film;

performing half etching from the other principal surface of the bump forming metal foil to form other half bumps that are integrated with the half bumps to constitute bumps;

laminating other insulating film for interlayer insulation on the other principal surface of the bump forming metal foil so as to make the other insulating film be penetrated with the other half bumps; and laminating other wiring film forming metal foil connected with the other half bumps on a surface of the other insulating film.

According to a thirteenth aspect of the present invention, there is provided the method of manufacturing a multilayer wiring substrate, characterized by comprising:

arranging above and under a wiring substrate comprised of a double-sided wiring substrate or multilayer wiring substrate connecting members between wiring films in which a plurality of bumps, which are formed approximately in a cone-shape, are embedded in an insulating film such that at least one ends of the bumps are projected therefrom; and arranging copper foils on an upper side of the upper connecting member between wiring films and on a lower side of the lower connecting member between wiring films and conducting pressing for their integration to connect wiring films of the wiring substrate comprised of the double-sided wiring substrate or multilayer wiring substrate with the copper foils.

According to a fourteenth aspect of the present invention, there is provided the method of manufacturing a connecting member between wiring films, characterized by comprising:

laminating a carrier layer on a bump forming metal layer;

forming resist patterns to an opposite surface of the bump forming metal layer to the surface on which the carrier layer is laminated;

conducting etching to the bump forming metal layer with the resist patterns serving as a mask to form a first member in which a plurality of bumps, which are formed approximately in a cone-shape, are projected from the carrier layer;

laminating an insulating film on the first member so as to make top portions of the bumps be exposed from the insulating film to form a second member;

removing the carrier layer from the second member to form a connecting member between wiring films;

laminating other carrier layer different from the carrier layer on other bump forming metal layer different from the bump forming metal layer;

forming other resist patterns different from the resist patterns to an opposite surface of the other bump forming metal layer to the surface on which the other carrier layer is laminated;

conducting etching to the other bump forming metal layer with the other resist patterns serving as a mask to form other first member in which a plurality of bumps, which are formed approximately in a cone-shape, are projected from the other carrier layer;

laminating the other first member and the connecting member between wiring films so as to make top portions of the bumps of the other first member be exposed from the insulating film of the connecting member between wiring films to form other second member different from the second member; and removing the other carrier layer from the other second member to form a new connecting member between wiring films in which bumps formed approximately in a cone-shape are embedded in an insulating film.

According to a fifteenth aspect of the present invention, there is provided the method of manufacturing a multilayer wiring substrate, characterized by comprising:

forming a conductive film to a connecting member between wiring films in which bumps formed approximately in a cone-shape are embedded in an insulating film;

forming wiring patterns on the conductive film through plating; and removing the conductive film through quick etching.

According to a sixteenth aspect of the present invention, there is provided the connecting member between wiring films, characterized in that a plurality of members, in which bumps formed approximately in a cone-shape are embedded in an insulating film, are laminated such that respective bumps are overlapped with one another.

BRIEF DESCRIPTION OF THE DRAWINGS

In the accompanying drawings:

FIGS. 8(A) to 8(D) show Embodiment 3 of the present invention, being sectional views showing a method of manufacturing a wiring substrate in order of manufacturing step;

FIGS. 9(A) to 9(E) show Embodiment 4 of the present invention, being sectional views showing a method of manufacturing a wiring substrate in order of manufacturing step;

FIGS. 15(A) and 15(B) show Embodiment 8 of the present invention, being sectional views showing a method of manufacturing a wiring substrate in order of manufacturing step;

FIGS. 22(A) to 22(D) show Embodiment 12 of the present invention, being sectional views showing a method of manufacturing a multilayer wiring substrate in order of manufacturing step;

FIG. 23 shows Embodiment 13 of the present invention, being a sectional view showing the method of manufacturing a multilayer wiring substrate in order of manufacturing step;

FIGS. 24(A) to 24(D) show Embodiment 14 of the present invention, being sectional views showing a method of manufacturing a multilayer wiring substrate in order of manufacturing step;

FIGS. 25(A) to 25(C) show Embodiment 15 of the present invention, being sectional views showing a method of manufacturing a multilayer wiring substrate in order of manufacturing step;

FIGS. 26(A) to 26(G) are sectional views showing a conventional method of manufacturing a multilayer wiring substrate in order of manufacturing step; and FIG. 27 is a sectional view showing an example of limitation of a pitch of a bump.

DETAILED DESCRIPTION OF THE PREFERRED EMBODIMENTS

Figure 1:
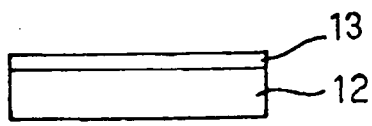
FIGS. 1(A) to 1(H) show Embodiment 1 of the present invention, being sectional views showing a method of manufacturing a multilayer wiring substrate in order of manufacturing step, with FIG. 1(F') showing a modification example of FIG. 1(F)
Figure 1:
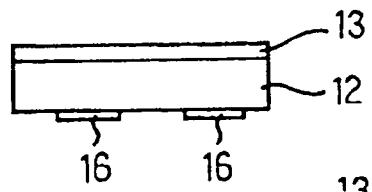
Figure 1:
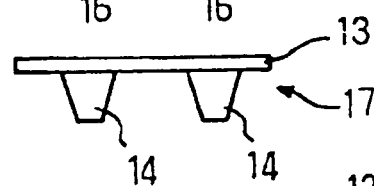
Figure 1:
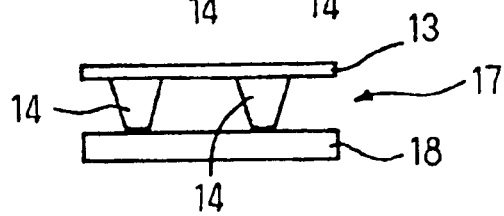
Figure 1:
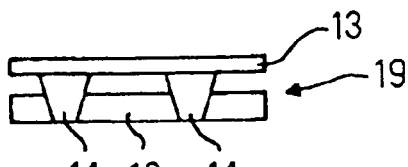
Figure 1:
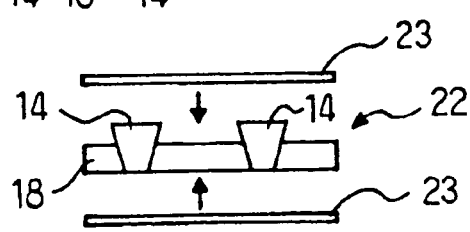
Figure 1:
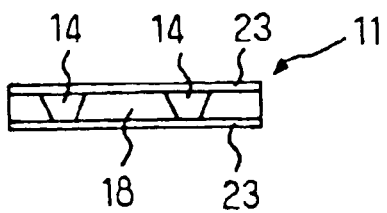

The present invention will be specifically described below with reference to embodiments shown in the accompanying drawings.

1) Embodiment 1

FIGS. 1(A) to 1(H) show Embodiment 1, being sectional views showing a method of manufacturing a multilayer wiring substrate in order of manufacturing step.

A. First, a first resin film 13 that serves as a carrier layer is laminated (adhered) to a copper foil 12 that serves as a bump forming metal layer through an adhesive or direct cladding (FIG. 1(A)).

The thickness of the copper foil 12 is arbitrarily set and determined in accordance with the height of a bump 14 to be formed. For example, the thickness is set to 100 μm. Incidentally, for example, a metal foil that is made of aluminum or the like may be laminated as the carrier layer to the copper foil 12 instead of the first resin film 13.

B. Etching resist patterns 16 that are used for forming bumps are formed on one surface of two surfaces of the copper foil 12, on the other surface of which the first resin film 13 is laminated (FIG. 1(B)).

C. The copper foil 12 is then subjected to etching by using the etching resist patterns 16 as masks. Thus, there is formed a first member 17 in which the bumps 14 formed approximately in a cone-shape are provided on the first resin film 13 so as to be projected therefrom (FIG. 1(C)). The size of the bump 14 is arbitrarily set, but when a height thereof is set to 100 μm, it is determined, for example, that a top portion thereof has a diameter of 100 μm and a foot portion thereof has a diameter of 150 μm.

D. A second resin film 18 that serves as an insulating film corresponding to an insulating film of the wiring substrate is then abutted against the first member 17 from the side where the bumps 14 are projected (FIG. 1(D)). The thickness of the second resin film 18 is also arbitrarily set but, for example, it is set to 50 μm. Examples of the preferable materials include thermoplastic resin such as liquid crystal polymer, poly(etheretherketone) resin, poly(ethersulfone) resin, poly(phenylene sulfide) resin, fluorine resin, polyimide resin, and epoxy prepreg in the state of B-stage of thermosetting resin.

E. The first member 17 is laminated on the second resin film 18 so that the top portions of the bumps 14 are exposed, to thereby form a second member 19 (FIG. 1(E)).

Note that, the lamination of the second resin film 18 to the first member 17 is specifically performed by the procedure shown in FIGS. 2(A) to 2(C), for example. That is, the second resin film 18 is first abutted against the first member 17 from the side where the bumps 14 are projected (FIG.

2(A)). Then, the second resin film 18 is scraped by a sharpening stone 21 (FIG. 2(B)). Accordingly, the resin corresponding to the top portions of the bumps 14 is polished and removed. The top portions of the bumps 14 go into the second resin film 18, and then, in a short period of time, break through the second resin film 18, to thereby obtain the state in which the top portions of the bumps 14 are exposed from the second resin film 18. Incidentally, a polishing roller or the like may also be employed instead of the sharpening stone 21.

F. Subsequently, when the bumps go into the resin film 18 and are maintained, the first resin film 13 is separated from the second member 19 (FIG. 1(F)). Thus, there is formed a connecting member between wiring films 22 in which the bumps 14 formed approximately in a cone-shape are provided so as to be embedded in the second resin film 18 that serves as the insulating film.

Note that, in addition to the connecting member between wiring films 22 shown in FIG. 1(F), that is, the connecting member between wiring films 22 in which the foot portions (base portions) of the bumps 14 formed approximately in a cone-shape are projected out the second resin film, there may also be obtained the connecting member between wiring films 22 shown in FIG. 1(F'), that is, the connecting member between wiring films 22 in which the top portions of the bumps 14 are projected out the second resin film 18.

Figure 3:
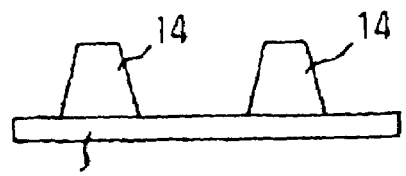
FIGS. 3(A) to 3(C) are sectional views showing an example of the method of manufacturing a connecting member between wiring films shown in FIG. 1(F') in order of manufacturing step.
Figure 3:
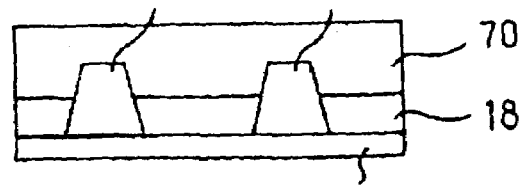
Figure 3:

FIGS. 3(A) to 3(C) show a method of obtaining the connecting member between wiring films 22 shown in FIG. 1(F'). Specifically, the state shown in FIG. 3(A) (same as in FIG. 1(C)) is provided, then an elastic sheet, for example, a sheet 70 made of polyethylene, polypropylene, paper, polyvinylidene chloride, or rubber is disposed on the second resin film 18, and the entire surface is pressed, to thereby obtain the state shown in FIG. 3(B). Then, the sheet 70 and the first resin film 13 are removed, with the result that the state shown in FIG. 3(C) is provided. Accordingly, the connecting member between wiring films 22 shown in FIG. 1(F') can be obtained.

Figure 4:
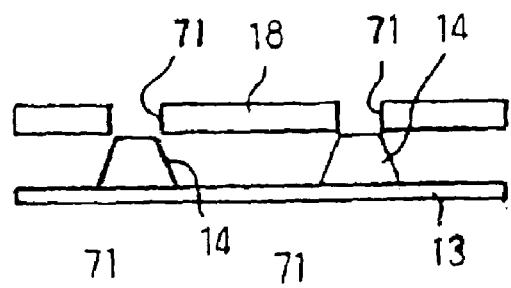
FIGS. 4(A) to 4(C) are sectional views showing another example of the method of manufacturing a connecting member between wiring films shown in FIG. 1(F') in order of manufacturing step.
Figure 4:
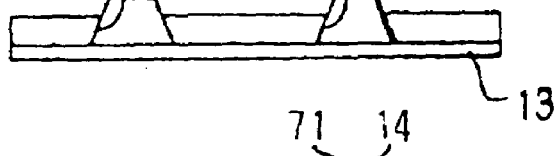
Figure 4:

Also, by employing the resin film 18 in which holes are bored in advance at predetermined positions by a boring method with a drill, punching, or a laser beam, the connecting member between wiring films 22 shown in FIG. 1(F') may also be obtained. FIGS. 4(A) to 4(C) show a method of obtaining the above connecting member between wiring films 22.

Figure 2:
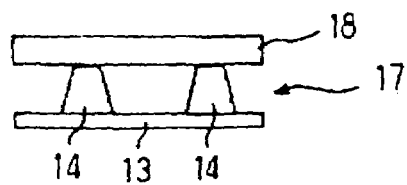
FIGS. 2(A) to 2(C) are sectional views showing an example of a method of laminating a second resin film that is an insulating film and a first member according to Embodiment 1 above in order of manufacturing step.
Figure 2:
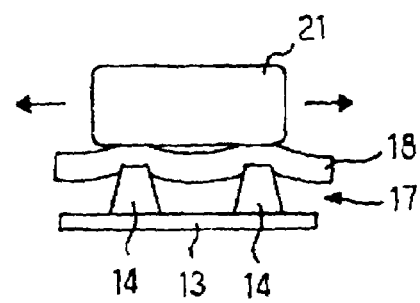
Figure 2:
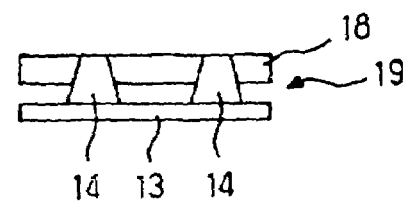

That is, the second resin film 18 having no hole is prepared in the steps shown in FIG. 1(D) and FIG. 2. However, in this method, there is prepared the second resin film 18 in which a hole 71 having at least a diameter smaller than the diameter of the base portion (foot portion) of the bump 14 is formed at the position corresponding to the bump 14, as shown in FIG. 4(A).

Thereafter, the alignment of the second resin film 18 is conducted on the first resin film 13 on which the bumps 14 are formed so as to make each hole 71 correspond to each bump 14, and the integration is attained by room-temperature compression bonding or thermo-compression bonding. FIG. 4(B) shows the state after the integration.

Thereafter, the separation of the first resin film 13 is conducted as shown in FIG. 4(C). By such a method as well, the connecting member between wiring films 22 shown in FIG. 1(F') can be obtained.

The description will be continued from the step G following the step shown in FIG. 1(F).

G. Two wiring film forming copper foils 23 are abutted against both sides of the connecting member between wiring films 22 (FIG. 1(G)).

H. The wiring film forming copper foils 23 and the connecting member between wiring films 22 are then pressed at a temperature of 300° C. or higher, for example, in the case of liquid crystal polymer (FIG. 1(H)). Thus, the wiring film forming copper foils 23 and the bumps 14 similarly made of copper are firmly bonded to each other due to the use of the same kind of metal (Cu—Cu bonding), to thereby realize a satisfactory conductivity state.

Modification Example

Figure 5:
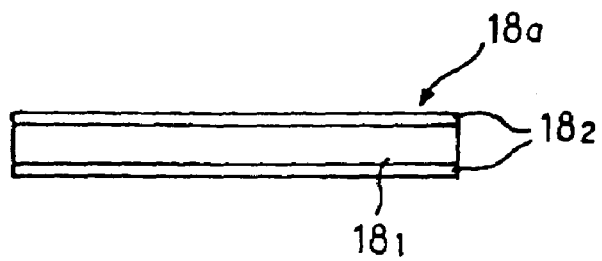
FIGS. 5(A) to 5(C) show a modification example of Embodiment 1, being sectional views showing a method of manufacturing a wiring substrate in order of manufacturing step.
Figure 5:
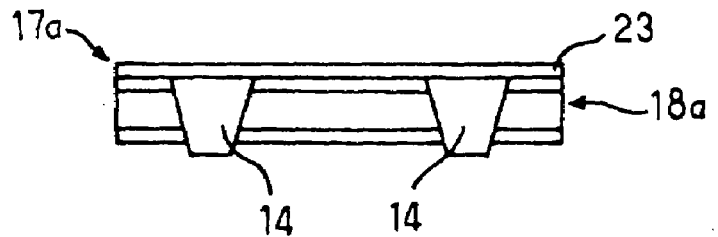
Figure 5:
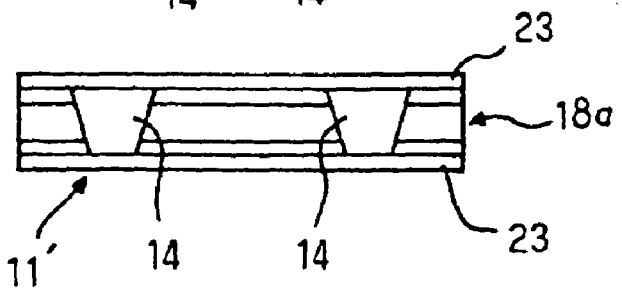

FIGS. 5(A) to 5(C) show a modification example of Embodiment 1, being sectional views showing a method of manufacturing a wiring substrate in order of manufacturing step.

A. First, as shown in FIG. 5(A), a resin film 18a with a three-layer structure is prepared. The resin film 18a is formed by bonding, to both sides of a polyimide film $18_1$ that serves as a core, polyimide films $18_2$ which are made of thermoplastic polyimide, epoxy denatured thermosetting adhesive, or the like and can be subjected to thermo-compression bonding.

One of points of this modification example which is different from Embodiment 1 showing the manufacturing method in FIGS. 1(A) to 1(H) is that the resin film 18a with a three-layer structure is used instead of the second resin film 18 that serves as the interlayer insulating film.

B. Next, as shown in FIG. 5(B), a member 17a in which the bumps 14 are formed on one of principal surfaces of the wiring film forming copper foil 23 is laminated on one of principal surfaces of the resin film 18a such that the bumps 14 penetrate the resin film 18a with a three-layer structure, and thermo-compression bonding is conducted thereto.

Note that the member 17a is formed by a method of, for example, laminating a copper foil for forming bumps on a resin film, performing selective etching to the copper foil, pressurizing and laminating a wiring film forming copper foil on the opposite surface to the resin film, and then, removing the resin film.

C. Next, as shown in FIG. 5(C), other wiring film forming copper foil 23 is laminated on the opposite surface of the resin film 18a to the surface on which the wiring film forming copper foil 23 is laminated, and thermo-compression bonding is conducted thereto. Then, a wiring substrate 11' in this modification example is obtained.

As described above, the wiring substrate 11 shown in FIGS. 1(A) to 1(H) provides the wiring substrate 11' as a modification example as shown in FIG. 5(C).

Figure 6:
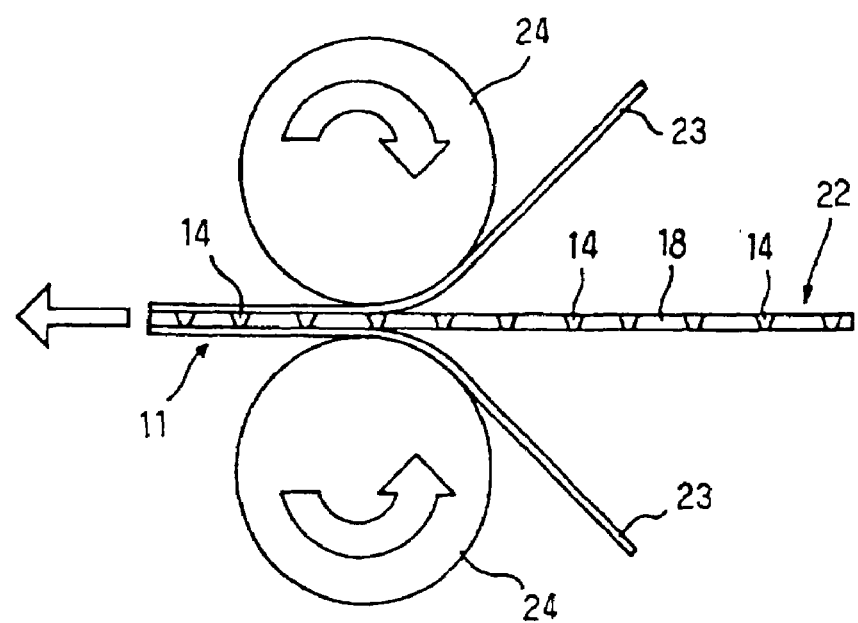
FIG. 6 is a sectional view showing an example of the step of laminating a wiring film forming copper foil on a connecting member between wiring films.

Note that, when the pressing is performed with respect to the wiring film forming copper foils 23, the connecting member between wiring films 22, and the like, the pressing may be conducted by passing them through two high-temperature rollers 24 as shown in FIG. 6, for example. Thus, the pressing is successively performed, and it is possible to enhance the production efficiency.

Thereafter, the wiring film forming copper foils 23 are subjected to etching as in the conventional technique, to thereby form the necessary wiring patterns (not shown, the like of the multilayer wiring substrate in the conventional technique shown in FIG. 26(G)).

Of course, the connecting member between wiring films 22 shown in FIG. 1(F') may be employed instead of the connecting member between wiring films 22 shown in FIG. 1(F) in the steps shown in FIGS. 1(G) and 1(H).

The rollers shown in FIG. 6 can also be used for the modification example shown in FIGS. 5(A) to 5(C) and various laminate layers described below.

2) Embodiment 2

FIGS. 7(A) to 7(E) show Embodiment 2 according to the present invention, being sectional views showing a method of manufacturing a wiring substrate in order of manufacturing step.

A. The first member 17 shown in FIG. 1(C) is formed by the method shown in FIGS. 1(A) to 1(C). Reference numeral 13 denotes a first resin film, reference numeral 14 denotes bumps formed approximately in a cone-shape, which are provided so as to be projected from the first resin film 13.

Here, the method shown in FIGS. 1(A) to 1(C) is simply described. The first resin film 13 that serves as the carrier layer is laminated on (adhered to) the copper foil 12 that serves as the bump forming metal layer, and the etching resist patterns 16 that are used for forming the bumps are formed on one surface of the two surfaces of the copper foil 12, on the other surface of which the first resin film 13 is laminated. The copper foil 12 is then subjected to the etching by using the etching resist patterns 16 as masks.

Thus, the first member 17 that is shown in FIG. 7(A) (FIG. 1(C)) is obtained.

B. Next, a second resin film 18 that serves as an insulating film corresponding to an insulating film of a wiring substrate is abutted against the first member 17 from the side from which the bumps 14 are projected, and the first member 17 is laminated on the second resin film 18 such that the top portions of the bumps 14 are exposed, to thereby form a second member 19. FIG. 7(B) shows the state after the formation of the second member 19.

In this case, the second resin film 18 is laminated so as to be bonded to the first resin film 13. This can be easily attained by, for example, the above method shown in FIGS. 4(A) and 4(B).

C. Next, a wiring film forming copper foil 23a is attached to the opposite side of the second member 19 to the side on which the first resin film 13 is provided, and is pressed to the resin film 13 to be laminated. FIG. 7(C) shows the state after the lamination.

D. Then, as shown in FIG. 7(D), the first resin film 13 is separated.

E. Thereafter, a wiring film forming copper foil 23b is attached to the surface from which the resin film 13 is separated, and in this state, the copper foil 23b is pressed to be laminated on the second member 19. Then, as shown in FIG. 7(E), there is obtained a multilayer wiring substrate 11a in Embodiment 2.

As described above, the wiring film forming copper foil 23a is pressed only to the opposite side to the resin film 13 without removing the resin film 13 with respect to the second member 19, then, the resin film 13 is removed, and thereafter, the second wiring film forming copper foil 23b is pressed to the surface from which the resin film 13 is removed. The reason for this is that variation of the forming position of the bumps 14 can be reduced more compared with the case where the wiring film forming copper foils 23 and 23 are pressed to be laminated to both the sides of the member, as in Embodiment 1 shown in FIG. 1.

That is, as in Embodiment 1 shown in FIG. 1, when the two copper foils 23 are pressed to the member from both the sides at a time to be integrated with the member, the positional relationship between the bumps 14 at the time of pressing is held only by the second resin film 18. Thus, slight deviation is caused by an impactive pressure applied at the time of pressing, which leads to slight variation in the formation position of the bumps 14. Therefore, in the case where the positional precision of the bumps 14 is required to be considerably high, the request may be difficult to meet with.

Figure 7:
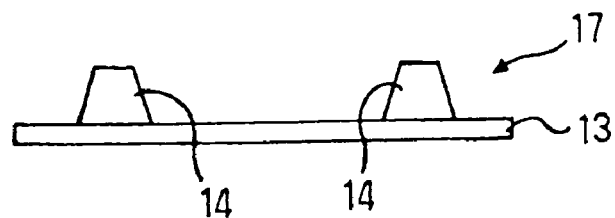
FIGS. 7(A) to 7(E) show Embodiment 2 of the present invention, being sectional views showing a method of manufacturing a wiring substrate in order of manufacturing step.
Figure 7:
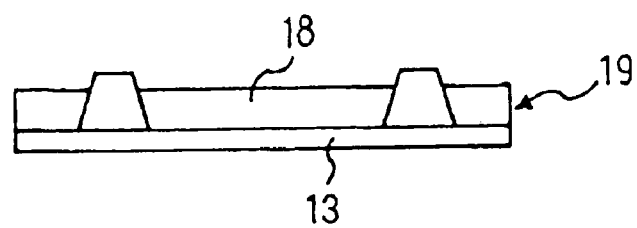
Figure 7:
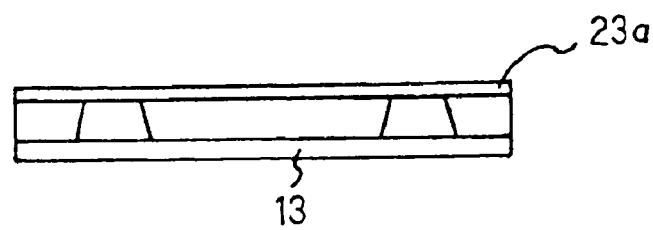
Figure 7:
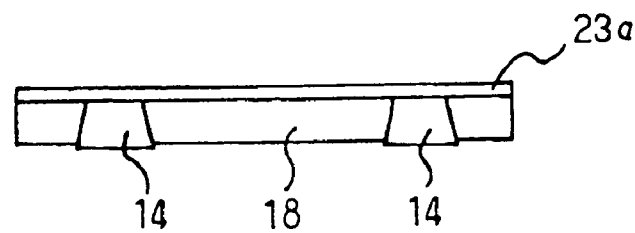
Figure 7:
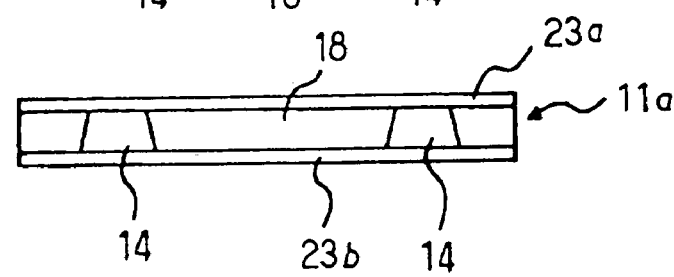

However, as in Embodiment 2 shown in FIG. 7, when the two copper foils 23a and 23b are laminated to the member by conducting different pressing processes twice, the mutual positional relationship of the bumps 14 can be regulated by the first resin film 13 and the second resin film 18 in the first lamination. Thus, the deviation of the mutual positional relationship between the bumps 14 can be made extremely small.

Then, the lamination with pressing of the copper foil 23b is conducted in the state where the mutual positional relationship between the bumps 14 is regulated by the copper foil 23a, and thus, the wiring substrate 11a can be formed while high precision on the positional relationship is maintained. Therefore, in the case where the mutual positional precision between the bumps 14 needs to be extremely high even if the number of steps is increased, the wiring substrate may be manufactured by the manufacturing method shown in FIG. 7. On the other hand, in the case where there is a strong request for reduction in not only the number of manufacturing steps but also manufacturing cost while decent positional precision is sufficient, the wiring substrate may be manufactured by the manufacturing method shown in FIG. 1.

3) Embodiment 3

FIGS. 8(A) to 8(D) show Embodiment 3 of the present invention, being sectional views showing a method of manufacturing a wiring substrate in order of manufacturing step.

A. A first member 17 shown in FIG. 8(A) is formed by the same method as shown in FIGS. 1(A) to 1(C). Reference numeral 13 denotes a resin film, and reference numeral 14 denotes bumps made of copper. Incidentally, the resin film 13 plays a part of a base in the formation of the bumps 14 at the beginning and further plays a part of an interlayer insulating film in a later stage, and thus, is not removed.

B. Next, a not-shown cushion member is provided below the resin film 13, and a pressure is applied thereto, whereby the bumps 14 are made to penetrate the resin film 13. FIG. 8(B) shows the state where the resin film 13 is penetrated with the bumps 14. Thus, the resin film 13 can be used as the interlayer insulating film.

Note that preferable materials for the cushion member include gas-forming materials, for example, expandable polypropylene and expandable urethane, thick paper, a rubber sheet, and the like.

C. Next, as shown in FIG. 8(C), two wiring film forming copper foils 23 are abutted against both sides of a connecting member between wiring films 22.

D. Thereafter, the wiring film forming copper foils 23 and the connecting member between wiring films 22 are pressed at a high temperature. Thus, a wiring substrate 11b shown in FIG. 8(D) is obtained. The wiring substrate 11b in Embodiment 3 is different from the above-described wiring substrates 11 and 11a in that the resin film 13 used as the base in the formation of the bumps 14 is used as the interlayer insulating film without being removed after the formation of the bumps 14. Therefore, a waste of the resin film 13 can be avoided, and further, reduction of the material cost can be attained.

4) Embodiment 4

FIGS. 9(A) to 9(E) show Embodiment 4 according to the present invention, being sectional views showing a method of manufacturing a wiring substrate in order of manufacturing step.

A. A one-side copper finishing laminate plate in which a resin film 18 (made of polyimide or LCP, for example) that serves as an interlayer insulating film is laminated on a wiring film forming copper foil 23 is prepared, and a protective film 13 is attached to the opposite surface of the resin film 18 that serves as the interlayer insulating film of the laminate sheet with respect to the surface on which the copper foil 23 is laminated. FIG. 9(A) shows the state after the attachment of the protective film 13.

Here, the protective film 13 is attached in order to prevent attack or surface dirt due to desmear processing conducted later.

Note that polyimide resin is used for the resin film 18 on the wiring film forming copper foil 23, and further, there may be used for the resin film 18 polyimide that can be applied to thermo-compression bonding, such as thermoplastic polyimide or epoxy denatured thermosetting adhesive. In this example, the protective film 13 is formed by thermo-compression bonding.

B. Next, bump corresponding holes are selectively formed in the protective film 13 and the resin film 18 by using a laser beam. Denoted by 18h are the bump corresponding holes, into which bumps are inserted and fit later. Thereafter, desmear processing is performed thereto. Specifically, after the holes are opened by using the laser beam, organic matter that remains on the surface of the copper foil 23 that is exposed as the inner bottom surface of each of the bump corresponding holes 18h is removed by using, for example, a potassium permanganate solution. Further, dry desmear processing may be conducted with the use of ozone, plasma, sandblast, liquid forming, or the like. FIG. 9(B) shows the state after the opening of the holes and the desmear processing.

Note that, instead of the opening of the holes with the laser beam, the opening of the holes may be selectively performed by exposure and developing by using a resin film imparted with photosensitivity as the resin film 18, to thereby form the bump corresponding holes 18h.

C. Next, as shown in FIG. 9(C), the protective film 13 is removed.

D. Then, a member 17a in which bumps 14 are formed on one of principal surfaces of a wiring film forming copper foil 23 is prepared, and the alignment of the member 17a is conducted such that the bumps 14 correspond to the bump corresponding holes 18h of the lamination body (lamination body in which the resin film 18 is laminated on the copper foil 23), with the result that the member 17a faces the hole formation surface of the lamination body. FIG. 9(D) shows the state in which the member 17a faces the lamination body.

E. Thereafter, the member 17a is pressed and laminated to the lamination body. Thus, there is obtained a wiring substrate 11c having the resin film 18 as the interlayer insulating film and having the bumps 14 positioned to the bump corresponding holes 18h. FIG. 9(E) shows the wiring substrate 11c.

The wiring substrate can also be obtained with the above-mentioned method. In accordance with the method, the bump corresponding holes 18h are formed in the resin film 18 so as to correspond to the bumps 14. Thus, there can be reduced the contamination due to waste and foreign matters which derive from the resin film 18 and which are generated when the bumps 14 are pushed into the resin film 18 to be inserted and fit thereinto.

Note that the member 17a can be obtained as follows. That is, the member 17 formed in accordance with the method shown in FIGS. 1(A) to 1(C) is prepared; the bumps 14 are fit into the bump corresponding holes 18h; then, before the pressing of the resin film 13 (refer to the first resin film 13 in FIGS. 1(A) to 1(C)), the resin film 13 is peeled; the wiring film forming copper foil 23 is superimposed thereon; and thereafter, the pressing of the copper foil 23 is performed.

Further, the bump corresponding holes 18h may be formed as follows. That is, a film made of photoresist is used as the protective film 13 in FIG. 9(A); the protective film is subjected to patterning through exposure and developing; and the resin film 18 is subjected to etching with the patterned protective film 13 as a mask.

Further, in Embodiment 4, porous polyimide resin (manufactured by Nitto Denko Corporation, for example) may be used for the resin film 18. This is because perforating property of the polyimide resin with respect to the bumps 14 is satisfactory because of the porousness, and thus, contamination and the like are not developed. In other words, as described above, in the case of ordinary resin that is not porous, the resin film 18 is difficult to be penetrated with the bumps 14, and the resin film is distorted, which leads to the generation of waste and foreign matters which serve as a contamination source. Thus, cleaning processing is required as described above. However, when the penetrating property is satisfactory, slight contamination develops, and thus, cleaning processing is performed with ease or not required. Incidentally, porous resin such as porous polyimide resin includes closed-cell type and opened-cell type. The closed-cell type has a tendency to exhibit the better penetrating property and produce less contamination and the like.

5) Embodiment 5

FIGS. 10(A) to 10(G) show Embodiment 5 according to the present invention, being sectional views showing a method of manufacturing a wiring substrate in order of manufacturing step.

A. First, as shown in FIG. 10(A), a lamination body is prepared in which an upper mold 80 is laminated on a resin film 18 that serves as an interlayer insulating film. The upper mold 80 is formed of metal (for example, SUS or the like) or resin, and has bump corresponding holes 82 that correspond to bumps 14 described later. Note that the bump corresponding holes 82 can be formed as follows. That is, photoresist is applied to the upper mold 80 adhered to the resin film 18; the photoresist is subjected to patterning through exposure and developing to be a mask film; and the upper mold 80 is subjected to etching with the mask film made of the photoresist as a mask. The formation of the bump corresponding holes 82 in the upper mold 80 may be conducted in the stage where the upper mold 80 has not been adhered to the resin film 18.

B. Next, as shown in FIG. 10(B), a member 17b is prepared in which the bumps 14 are formed on a lower mold 84 formed of metal (for example, SUS or the like) or resin. The alignment of the upper mold 80 is performed with the resin film 18 facing downward such that the bump corresponding holes 82 correspond to the bumps 14, with the result that the upper mold 80 faces the formation surface of the bumps 14 in the member 17b.

C. Next, as shown in FIG. 10(C), the upper mold 80 is pressurized to the lower mold 84 side, thereby obtaining the state where the resin film 18 is penetrated with the bumps 14.

D. Then, as shown in FIG. 10(D), the upper mold 80 is removed. Note that, the penetration causes the generation of waste and foreign matters and the like, that derive from resin, which leads to the contamination of the surface of the resin film 18. Thus, cleaning is preferably performed after the completion of this pressing step.

E. Next, as shown in FIG. 10(E), the lower mold 84 is removed.

F. Then, as shown in FIG. 10(F), wiring film forming copper foils 23 are made to face both sides of the resin film 18 penetrated with the bumps 14.

G. Thereafter, the wiring film forming copper foils 23 are pressed and laminated to the resin film 18. Thus, a wiring substrate 11d is completed.

Note that, in Embodiment 5 as well as in Embodiment 4, porous polyimide resin (manufactured by Nitto Denko, for example) may be used for the resin film 18.

Modification Example

Figure 10:
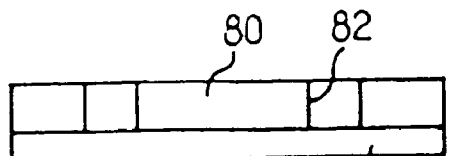
FIGS. 10(A) to 10(G) show Embodiment 5 of the present invention, being sectional views showing a method of manufacturing a wiring substrate in order of manufacturing step.
Figure 10:
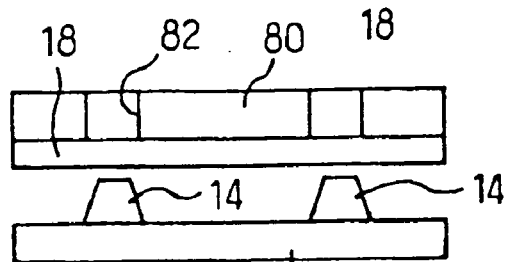
Figure 10:
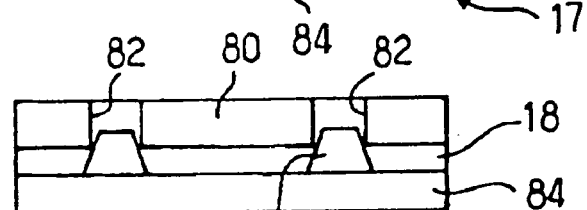
Figure 10:
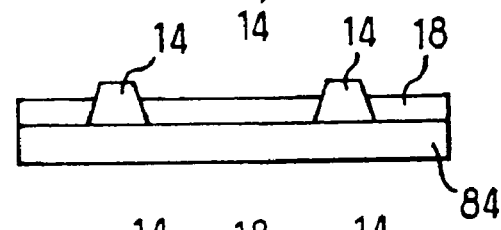
Figure 10:
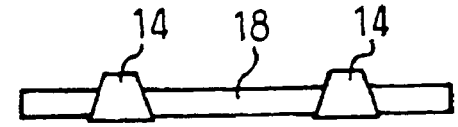
Figure 10:
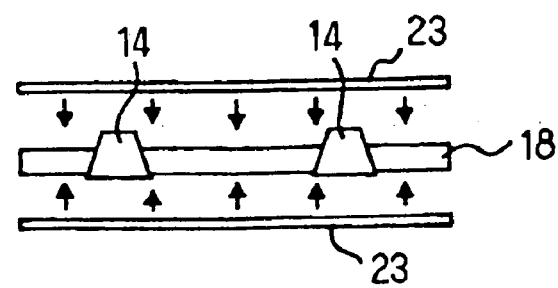
Figure 10:
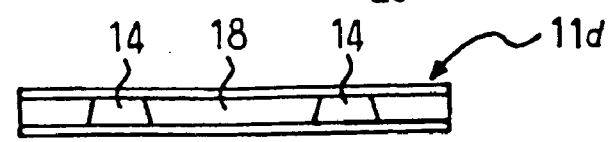
Figure 11:
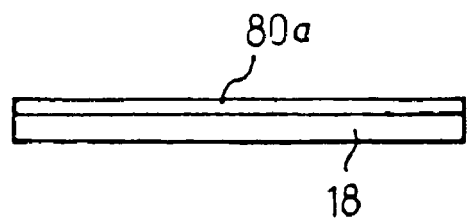
FIGS. 11(A) to 11(E) are sectional views showing a main portion of a modification example of the manufacturing method shown in FIGS. 10(A) to 10(G) in order of manufacturing step.
Figure 11:
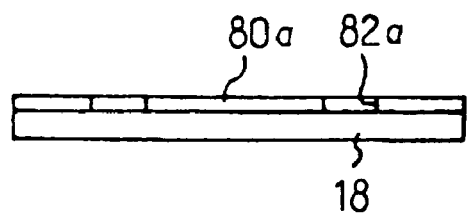
Figure 11:
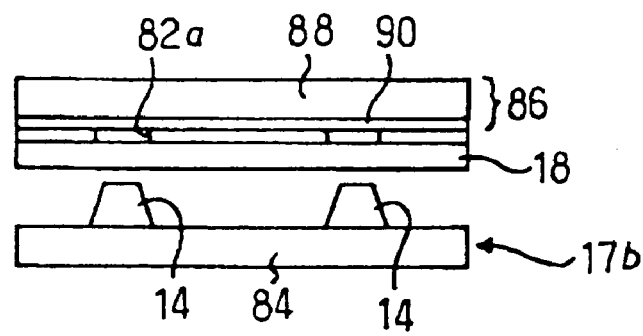
Figure 11:
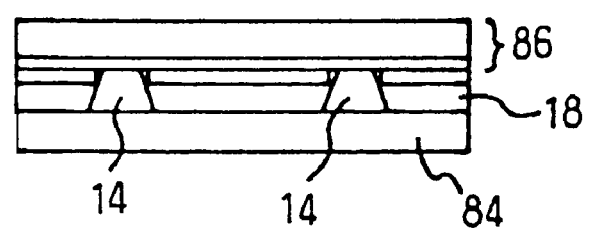
Figure 11:
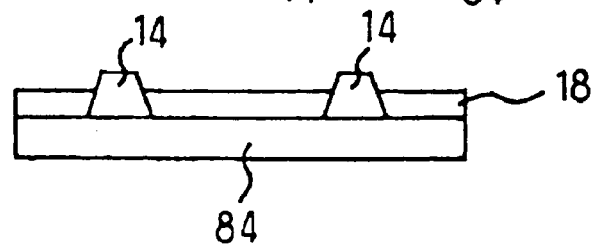

FIGS. 11(A) to 11(E) are sectional views showing a main portion of a modification example of the manufacturing method shown in FIG. 10 in order of manufacturing step.

A. First, as shown in FIG. 11(A), there is prepared one in which an upper mold 80a is formed on the resin film 18 that serves as the interlayer insulating film. The upper mold 80a is the same as one in the case of the manufacturing method shown in FIG. 10 in that it is formed of metal (for example, SUS) or resin, but employs one thinner than the one in that case. Specifically, there is used an upper mold substantially having a thickness obtained by subtracting the thickness of the resin film 18 from the height of the bump 14.

B. Next, as shown in FIG. 11(B), bump corresponding holes 82a are formed in the upper mold 80a so as to correspond to the bumps 14. The manufacturing method of the bump corresponding holes 82a may be the same as that shown in FIG. 10.

C. Next, a film 86 with adhesive 90 is adhered to the upper mold 80a. Reference numeral 88 denotes a main body of the film 86, and reference numeral 90 denotes adhesive. The film 86 with adhesive 90 reduces the contamination with waste and foreign matters that derive from the resin, which is caused by penetration of the bumps 14 in the resin film 18 in the later step.

The alignment of the film 86 with adhesive 90 and the upper mold 80a and the resin film 18 which are adhered thereto is performed such that the bump corresponding holes 82a correspond to the bumps 14, with the result that the film 86 with adhesive 90, the upper mold 80a, and the resin film 18 face the formation surface of the bumps 14 of the member 17b (in which the bumps 14 are formed on one of principal surfaces of the lower mold 84: refer to FIG. 10(B)). FIG. 11(C) shows the state where the film with adhesive 86, the upper mold 80a, and the resin film 18 face the formation surface.

D. Next, the upper mold 80a is pressed to the lower mold 84, thereby obtaining the state where the resin film 18 is penetrated with the bumps 14. FIG. 11(D) shows the state. Note that, it can be said tentatively that waste and foreign matters and the like that derive from resin are generated due to the penetration.

E. Subsequently, the film 86 with adhesive 90 is removed together with the upper mold 80a adhered to the film 86 by the adhesive 90. Then, the waste and foreign matters and the like of resin which are generated through the penetration are removed together with the film 86 with adhesive 90 and the upper mold 80a, with the result that the contamination of the wiring substrate due to the waste and foreign matters and the like, which derive from the resin, is almost eliminated. FIG. 11(E) shows the state after the removal of the film 86 with adhesive 90 and the upper mold 80a.

Thereafter, the wiring substrate 11d is obtained by the same method as shown in FIGS. 10(E) to 10(G).

In accordance with the above-mentioned manufacturing method, the contamination of the wiring substrate due to the waste and foreign matters and the like, which derive from the resin, is almost eliminated as described above. In view of this point, it can be said that the method is more excellent than that shown in FIG. 10.

Note that, in this modification example as well, porous polyimide resin (manufactured by Nitto Denko, for example) may be used for the resin film 18 that serves as the interlayer insulating film in order to reduce contamination more.

6) Embodiment 6

FIGS. 12(A) to 12(E) show Embodiment 6 according to the present invention, being sectional views showing a method of manufacturing a wiring substrate in order of manufacturing step. In Embodiment 6, the height of the bump is increased, for example, to twice or more that in Embodiment 5 shown in FIG. 10 and in the modification example thereof shown in FIG. 11.

Figure 12:
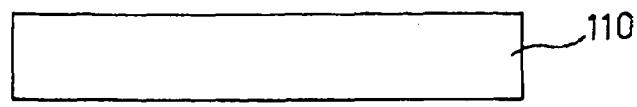
FIGS. 12(A) to 12(E) show Embodiment 6 of the present invention, being sectional views showing a method of manufacturing a wiring substrate in order of manufacturing step.
Figure 12:
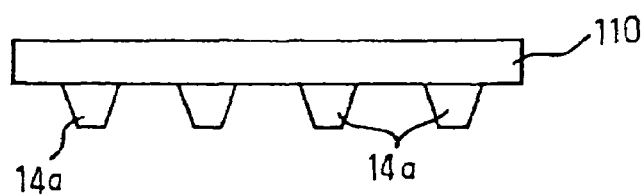
Figure 12:
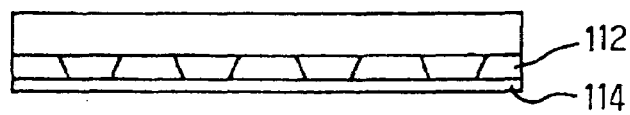
Figure 12:
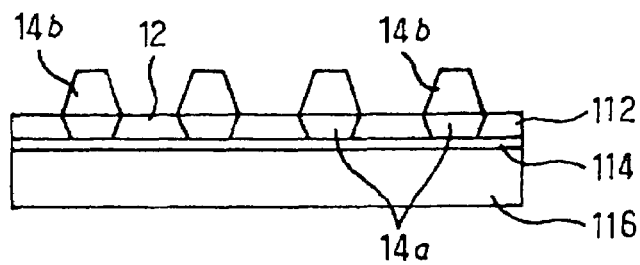
Figure 12:
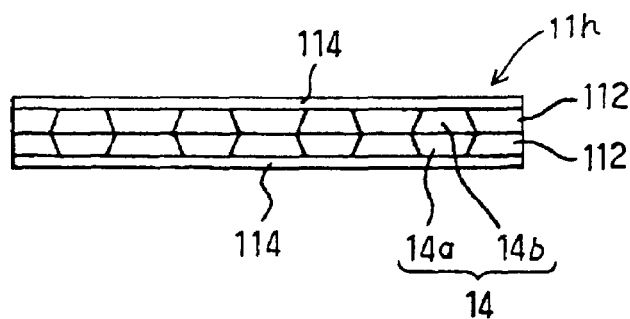

A. First, as shown in FIG. 12(A), a bump forming copper foil 110 that is appropriately thicker (for example, 150 μm) than the thickness of the bump to be formed (for example, 100 μm) is prepared.

B. Next, as shown in FIG. 12(B), selective half etching (for example, etching with a thickness of 75 μm) is performed to one of principal surfaces of the bump forming copper foil 110, thereby forming half bumps 14a.

C. Then, a resin film 112 that serves as an interlayer insulating film is laminated on the formation surface of the half bumps 14a of the bump forming copper foil 110 so as to be penetrated with the half bumps 14a. Further, a wiring film forming copper foil 114 is pressed to the resin film 112 and the formation surface of the half bumps 14a to be integrated therewith. FIG. 12(C) shows the state after the integration with pressing.

D. Next, the bump forming copper foil 110 is subjected to selective half etching (etching with a thickness of 75 μm) from the other surface (opposite surface to the formation surface of the half bumps 14a), thereby forming half bumps 14b that are integrated with the half bumps 14a to constitute bumps 14. FIG. 12(D) shows the state after the formation of the half bumps 14b.

E. Another resin film 112 that serves as an interlayer insulating film is laminated on the formation surface of the half bumps 14b of the bump forming copper foil 110 so as to be penetrated with the half bumps 14b. Further, another wiring film forming copper foil 114 is pressed to the resin film 112 and the formation surface of the half bumps 14b to be integrated therewith. FIG. 12(E) shows the state after the integration with pressing.

A wiring substrate 11h obtained through the above process can have its bumps 14 heightened without being limited in vain as to heightening of the arrangement density. That is, there may be a case where there is required the wiring substrate having the bumps 14 as low bumps with a height of about 50 μm, or a case where there is required the wiring substrate having the bumps 14 higher bumps with a height of, for example, about 100 μm. The wiring substrate with high bumps can be formed by conducting selective etching to a thick copper foil as a base. However, selective etching generally involves side etching, and the amount of side etching is proportional to the depth of etching. Therefore, as the wiring substrate with higher bumps is to be obtained, the amount of side etching becomes larger. In addition, the integration density becomes lower.

However, the half bumps 14a and 14b are formed by performing half etching from both the surfaces of the thick bump forming copper foil 110, and the bumps 14 are formed by combining the two type half bumps 14a and 14b, whereby the high bumps 14 can be formed with a little amount of side etching. Accordingly, the wiring substrate 11h with the high bumps 14 can be obtained without being limited in vain as to the arrangement density.

7) Embodiment 7

Figure 13:
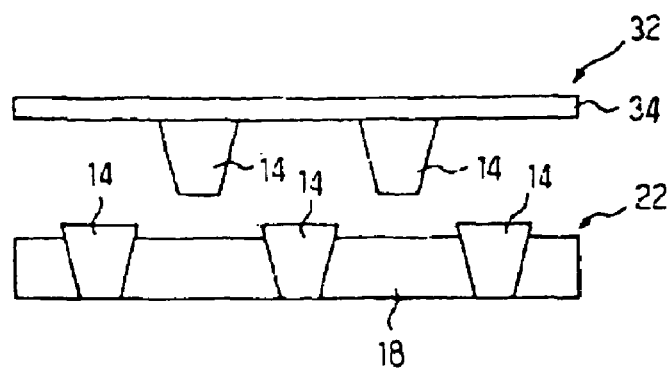
FIGS. 13(A) to 13(C) show Embodiment 7 of the present invention, being sectional views showing a method of manufacturing a wiring substrate in order of manufacturing step.
Figure 13:
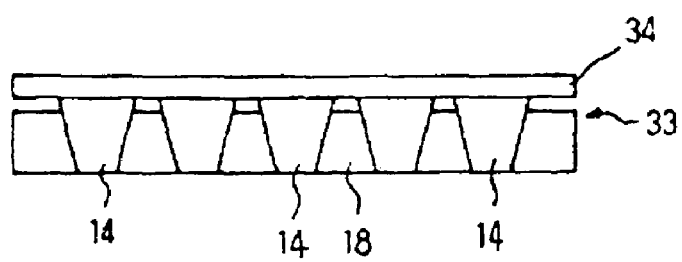
Figure 13:
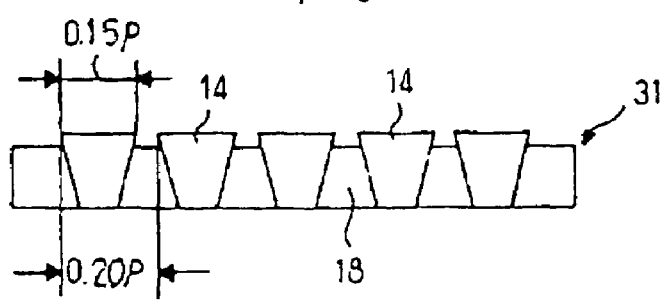

FIGS. 13(A) to 13(C) show Embodiment 7 according to the present invention, being sectional views showing a method of manufacturing a wiring substrate in order of manufacturing step. Embodiment 7 is intended to solve the limit of a pitch of a bump 14 through plural times of lamination of members.

A. First, the partial steps of Embodiment 1, that is, the steps shown in FIGS. 1(A) to 1(F) are performed, to thereby form a connecting member between wiring films 22 (FIG. 13(A)).

Then, similarly, the partial steps of Embodiment 1, that is, the steps shown in FIGS. 1(A) to 1(C) are performed, to thereby form another first member 22 (FIG. 13(A)). Note that the expression "other" is added here, because the first member 17 is formed in the middle of forming the above-described connecting member between wiring films 22 (corresponding to FIG. 1(C) from among FIGS. 1(A) to 1(F)), it is intended to clearly describe that a first member is formed separately therefrom (hereinafter, the same shall apply)

B. Next, both the connecting member between wiring films 22 and the other first member 32 are stacked in the positional relationship shown in FIG. 13(A). The first member 32 is laminated on the connecting member between wiring films 22 such that top portions of the bumps 14 of the first member 32 are exposed out of a second resin film 18 of the connecting member between wiring films 22. Thus, another second member 33 is formed (FIG. 13(B)).

C. Then, the other first resin film 34 is removed from the other second member 33. Accordingly, a new connecting member between wiring films 31 is formed in which the bumps 14 formed approximately in a cone-shape are provided so as to be embedded in the second resin film 18 (FIG. 13(C)).

P (pitch) of the bump 14 of the new connecting member between wiring films 31 is 0.2 mmP, for example. The pitch of each bump 14 of the connecting member between wiring films 22 and the first member 32, which serve as a source, is 0.4 mmP, for example, with the result that the pitch is half.

Figure 14:
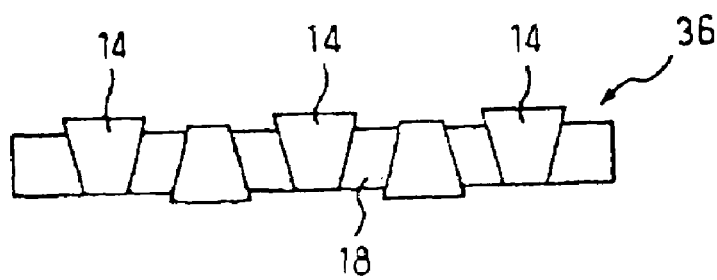
FIG. 14 shows a modification example of the embodiment shown in FIGS. 13(A) to 13(C), being a sectional view showing an example of the connecting member between wiring films on which bumps are alternately laminated such that a direction of one bump is opposite to that of the adjacent bump.

Note that, as to the lamination direction, both the members may be laminated such that a direction of one bump is opposite with respect to that of the adjacent bump as in a connecting member between wiring films 36 shown in FIG. 14, for example. Further, the number of laminations is not limited to one as in the connecting member between wiring films 31 in Embodiment 2, and the lamination may be performed twice or three times. The first member 32 may have a different diameter of the bump 14 from that of the connecting member between wiring films 22.

8) Embodiment 8

FIGS. 15(A) and 15(B) show Embodiment 8 according to the present invention, being sectional views showing a method of manufacturing a wiring substrate in order of manufacturing step. According to Embodiment 8, pressing is performed by one operation, thereby forming a multilayer wiring substrate 41.

A. First, each of three pieces of connecting member between wiring films 46 to 48 is disposed between each of four pieces of double-sided wiring substrates 42 to 45, for example (FIG. 15(A)).

B. Subsequently, the above substrates and connecting members are pressed collectively at a high temperature, thereby completing the multilayer wiring substrate 41 (FIG. 15(B)).

In this case, all of the steps of Embodiment 1 and patterning to wiring film forming copper foils 23 are conducted, thereby forming the four pieces of double-sided wiring substrates 42 to 45. Whereas, the partial steps (FIGS. 1(A) to 1(F)) of Embodiment 1 are conducted, thereby forming the three pieces of connecting member between wiring films 46 to 48.

9) Embodiment 9

FIGS. 16(A) to 16(E) show Embodiment 9 according to the present invention, being sectional views showing a method of manufacturing a wiring substrate in order of manufacturing step.

Figure 16:
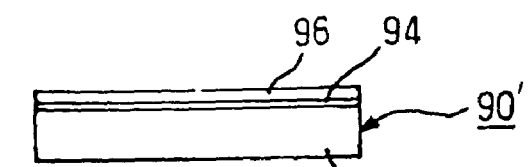
FIGS. 16(A) to 16(E) show Embodiment 9 of the present invention, being sectional views showing a method of manufacturing a wiring substrate in order of manufacturing step.
Figure 16:
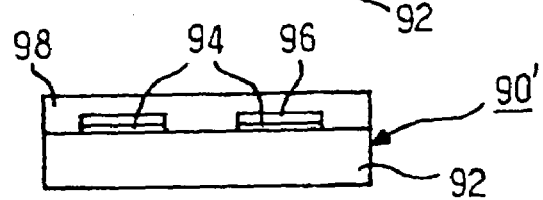
Figure 16:
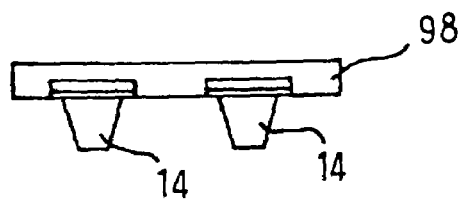
Figure 16:
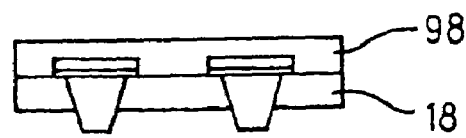
Figure 16:

A. As shown in FIG. 16(A), a metal laminate body 90' with a three-layer structure is prepared. In the metal laminate body 90' with a three-layer structure, a wiring film forming copper foil 96 with a thickness of, for example, 18 μm is laminated on a surface of a bump forming copper foil 92 with a thickness of, for example, about 100 μm through an etching barrier layer 94 with a thickness of, for example, about 0.1 μm which is made of nickel.

B. The copper foil 94 is subjected to patterning through selective etching (etching in which photoresist is applied, and is subjected to patterning through exposure and developing, and the patterned photoresist is used as a mask). Further, the etching barrier layer 94 is subjected to etching with the patterned copper foil 94 as a mask. Thereafter, a resin film 98 is adhered to the surface of the metal laminate body 90' with a three-layer structure on which the copper foil 96 and the etching barrier layer 94 are formed. FIG. 16(B) shows the state after the adhesion.

As the resin film 98, there is used a material having property in which an adhesive force is disappeared due to heat or ultraviolet rays and in which resin is not transferred to other film (for example, REVALPHA (trade name) manufactured by Nitto Denko Corporation, which serves as a sheet adherence of which is disappeared due to heat).

C. As shown in FIG. 16(C), the bump forming copper foil 92 is subjected to selective etching from the rear surface (lower surface) side, to thereby form bumps 14.

D. Next, as shown in FIG. 16(D), a resin film 18 that serves as an interlayer insulating film is laminated on the resin film 98 so as to be penetrated with the bumps 14.

E. Then, for example, irradiation of ultraviolet rays is performed to the resin film 98 to deprive the adhesive force, whereby the resin film 98 is removed. FIG. 16(E) shows a wiring substrate 11e that is obtained after the removal of the resin film 98. The wiring substrate 11e greatly differs from the wiring substrates 11 and 11a to 11d in that a wiring film is formed only on one of the principal surfaces.

Figure 17:
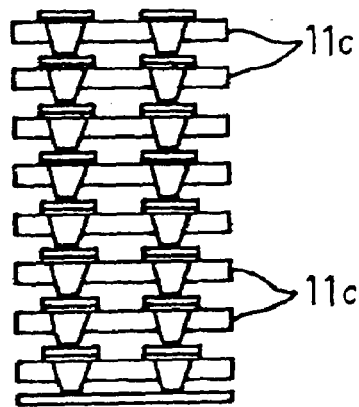
FIGS. 17(A) and 17(B) show an example of the method of laminating a large number of the wiring substrates manufactured by the method shown in FIGS. 16(A) to 16(E), thereby manufacturing a high integrated multilayer wiring substrate.
Figure 17:
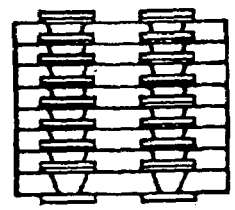

FIGS. 17(A) and 17(B) show an example of a method of manufacturing a high-integrated multilayer wiring substrate through lamination of a large number of wiring substrates 11e described above.

A. First, as shown in FIG. 17(A), a predetermined number of wiring substrates 11e are prepared, and they are overlapped with one another in a predetermined positional relationship.

B. Next, as shown in FIG. 17(B), the predetermined number of overlapped wiring substrates 11e are pressed to be integrated with one another.

In this way, a large number of wiring substrates 11e, in which a wiring film is formed only on one of the principal surfaces, are laminated to be integrated with one another, whereby the high-integrated multilayer wiring substrate can also be obtained.

10) Embodiment 10

FIGS. 18(A) to 18(E) show Embodiment 10 according to the present invention, being sectional views showing a method of manufacturing a wiring substrate in order of manufacturing step.

Figure 18:
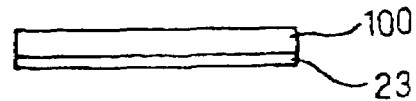
FIGS. 18(A) to 18(E) show Embodiment 10 of the present invention, being sectional views showing a method of manufacturing a wiring substrate in order of manufacturing step.
Figure 18:
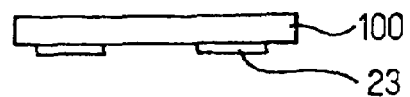
Figure 18:
Figure 18:
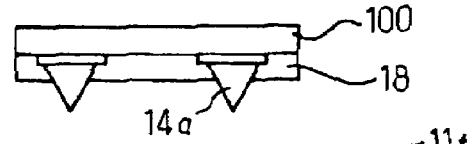
Figure 18:
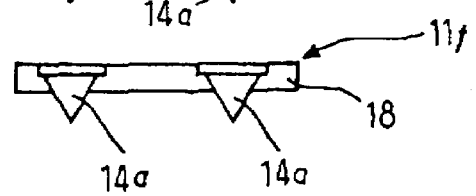

A. First, as shown in FIG. 18(A), there is prepared one in which a wiring film forming copper foil 23 is adhered to one of principal surfaces of an adhesive sheet 100.

B. Next, as shown in FIG. 18(B), the wiring film forming copper foil 23 is subjected to patterning through, for example, photo etching, thereby forming wiring films.

C. Then, as shown in FIG. 18(C), bumps 14a made of a conductive paste film are formed on the respective wiring films 23. The conductive paste is formed by mixing powder of metal such as silver or copper, a binder, and a solvent.

D. Subsequently, as shown in FIG. 18(D), a resin film 18 that serves as an interlayer insulating film is adhered to the adhesive sheet 100 so as to be penetrated with the bumps 14a.

E. Thereafter, the adhesive sheet 100 is removed. Thus, FIG. 18(E) shows a wiring substrate 11f that is obtained after the removal of the adhesive sheet 100. The wiring substrate 11f greatly differs from the wiring substrates 11 and 11a to 11d in that the wiring films are formed only on one of the principal surfaces, and differs from any of the wiring substrates 11 and 11a to 11e in that the bumps 14a are formed from the conductive paste.

Figure 19:
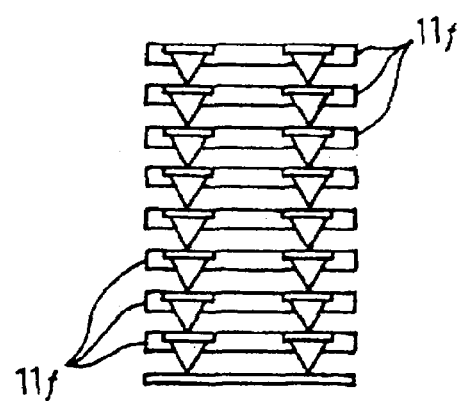
FIGS. 19(A) and 19(B) show an example of the method of laminating a large number of the wiring substrates manufactured by the method shown in FIGS. 16(A) to 16(E), thereby manufacturing a high integrated multilayer wiring substrate.
Figure 19:
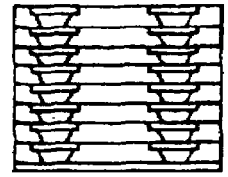
Figure 20:
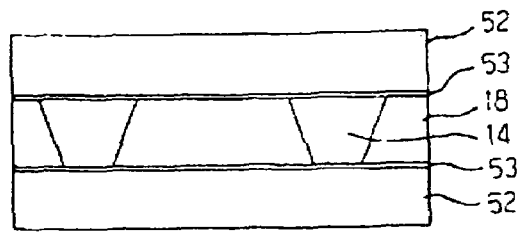
FIGS. 20(A) to 20(D) show Embodiment 11 of the present invention, being sectional views showing a method of manufacturing a multilayer wiring substrate in order of manufacturing step.
Figure 20:
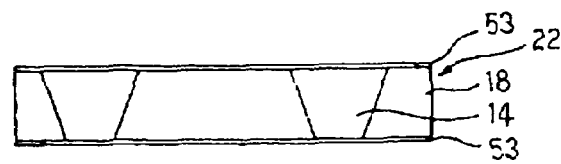
Figure 20:
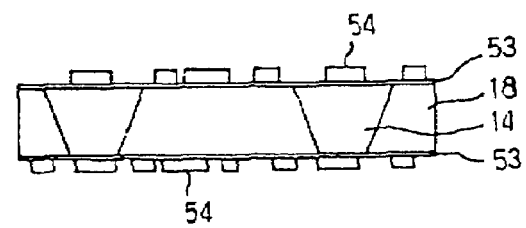
Figure 20:
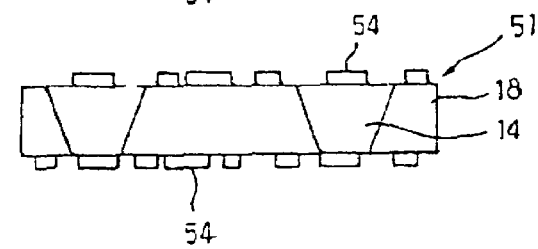

FIGS. 19(A) and 19(B) show an example of a method of manufacturing a high-integrated multilayer wiring substrate through lamination of a large number of wiring substrates 11f described above.

A. First, as shown in FIG. 19(A), a predetermined number of wiring substrates 22f are prepared, and they are overlapped with one another in a predetermined positional relationship.

B. Next, as shown in FIG. 19(B), the predetermined number of overlapped wiring substrates 11f are pressed to be integrated with one another.

In this way, a large number of wiring substrates 11f, in which the wiring films are formed only on one of the principal surfaces and the bumps 14a are formed from the conductive paste, are laminated to be integrated with one another, whereby the high-integrated multilayer wiring substrate can also be obtained.

11) Embodiment 11

FIGS. 20(A) to 20(D) show Embodiment 11 according to the present invention, being sectional views showing a method of manufacturing a multilayer wiring substrate in order of manufacturing step. In Embodiment 11, wiring patterns are formed on both surfaces of a connecting member between wiring films 22 by a semi-additive process.

A. First, 3 μm thick copper foils 53 which are supported by respective aluminum carriers 52 are laminated on both the surfaces of the connecting member between wiring films 22, and then the pressing of those is conducted, to thereby achieve their integration (FIG. 20(A)).

B. The separation of the aluminum carriers 52 is conducted by etching, and the copper foils 53 laminated on both the surfaces of the connecting member between wiring films 22 are exposed (FIG. 20(B)).

C. Next, reverse plating resists of necessary patterns (not shown) are formed. Wiring patterns 54 are formed on the surface of each of the copper foils 53 through plating by using the copper foils 53 as conductive films, and then, the separation of the plating resists is performed (FIG. 20(C)).

D. The copper foils 53 having a thickness of 3 μm are removed through quick etching.

In this case, the patterns 54 are simultaneously subjected to etching, but the etched amount is small. Thus, the patterns 54 have no problem as patterns. Accordingly, a multilayer wiring substrate 51 on both surfaces of which the wiring patterns 54 are provided is completed (FIG. 20(D)).

Note that porous polyimide resin (manufactured by Nitto Denko, for example) may be used for a resin film 18. This is because penetrating property of the polyimide resin with respect to bumps 14 is satisfactory because of the porousity, and thus, contamination and the like are not developed. In other words, in the case of ordinary resin that is not porous, the resin film 18 is difficult to be penetrated with the bumps 14, and the resin film is distorted, which leads to the generation of waste and foreign matters which serve as a contamination source. However, when a porous resin film is used, the satisfactory penetrating property is provided, and thus, slight contamination develops. Incidentally, porous resin such as porous polyimide resin includes closed-cell type and opened-cell type. The closed-cell type has a tendency to exhibit the better penetrating property and produce less contamination and the like.

12) Embodiment 12

Figure 21:
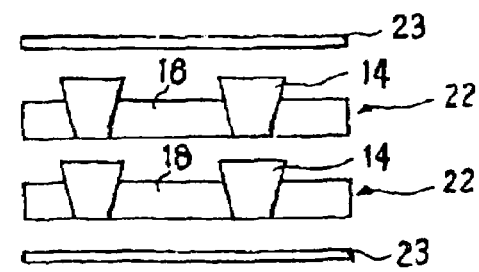
FIGS. 21(A) and 21(B) show Embodiment 12 of the present invention, being sectional views showing a method of manufacturing a multilayer wiring substrate in order of manufacturing step.
Figure 21:
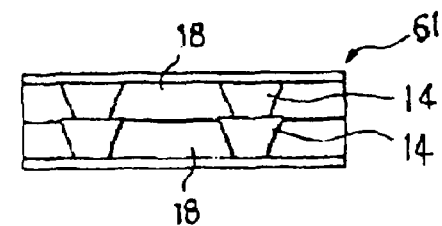

FIGS. 21(A) and 21(B) show Embodiment 12, being sectional views showing a method of manufacturing a multilayer wiring substrate in order of manufacturing step. According to Embodiment 12, bumps 14 are overlapped in a form of two stages.

A. Two pieces of connecting members between wiring films 22 are arranged so as to be overlapped, and copper foils 23 that serve as wiring films are disposed above and under the two connecting members (FIG. 21A).

B. Pressing of those is performed collectively at a high temperature. Thus, a multilayer wiring substrate 61 is completed in which the bumps 14 are overlapped in a form of two stages (FIG. 21B).

Originally, in the case where the bump is intended to be heightened, when the thickness of a bump forming metal layer 12 is simply increased, the diameter of a foot portion of the bump is increased due to the heightened bump even if the diameter of a top portion is not changed. As a result, the pitch of the bump cannot be prevented from being increased.

However, when the method of overlapping the bumps 14 is employed as in Embodiment 12, the height of the bump 14 is not increased, and thus, the diameter of the foot portion of the bump 14 remains small while being not increased. As a result, the pitch of the bump 14 can be kept small.

Incidentally, in Embodiment 12, the bumps 14 are overlapped in a form of two stages, but they may be overlapped in multistage.

13) Embodiment 13

FIGS. 22(A) to 22(D) show Embodiment 13 according to the present invention, being sectional views showing a method of manufacturing a wiring substrate in order of manufacturing step.

A. As shown in FIG. 22(A), a metal laminate body 90 with a three-layer structure is prepared. In the metal laminate body 90 with a three-layer structure, a wiring film forming copper foil 96 with a thickness of, for example, about 9 µm is laminated on a surface of a bump forming copper foil 92 with a thickness of, for example, about 100 µm through an etching barrier layer 94 with a thickness of, for example, about 0.1 µm which is made of nickel.

B. Next, selective etching is performed to the bump forming copper foil 92 of the metal laminate body 90, thereby forming bumps 14 as shown in FIG. 22(B). In this case, the etching barrier layer 94 inhibits etching of the wiring film forming copper foil 96.

Thereafter, in order to avoid the state where the bumps 14 are electrically connected to each other through the etching barrier layer 94, the etching barrier layer 94 is selectively removed with the bumps 14 serving as masks.

C. Next, a resin film 98, which serves as an interlayer insulating film and is made of, for example, polyimide resin, thermosetting resin, or the like, is laminated on the bump formation surface of the laminate body 90 so as to be penetrated with the bumps 14. FIG. 22(C) shows the state after the lamination.

D. Then, selective etching treatment is performed to the wiring film forming copper foil 96, thereby forming the wiring film 96'. Thus, a wiring substrate 11h is obtained as shown in FIG. 22(D).

The wiring substrate 11h is the most suitable as, for example, a bear chip or a conductor for a wafer burn-in test. FIG. 23 is a sectional view showing the state where the wiring substrate 11h is used as the conductor for a wafer burn-in test. In the figure, reference numeral 100 denotes a semiconductor wafer, reference numeral 102 denotes I/O electrodes thereof, reference numeral 104 denotes a connector on the test circuit side, and reference numeral 106 denotes terminals thereof. The wiring substrate 11h is intervened as the conductor between the terminals 106 and the electrodes 102 of the wafer 100, and maintains the electrical connecting state in the burn-in test.

Note that, porous polyimide resin (manufactured by Nitto Denko, for example) may be used as the polyimide resin. This is because penetrating property of the polyimide resin with respect to the bumps 14 is satisfactory because of the porosity, and thus, contamination and the like are not developed. Porous resin such as porous polyimide resin includes closed-cell type and opened-cell type. The closed-cell type has a tendency to exhibit the better penetrating property and produce less contamination and the like.

14) Embodiment 14

FIGS. 24(A) to 24(D) show Embodiment 14, showing a method of manufacturing a multilayer wiring substrate in order of manufacturing step. According to Embodiment 14, there is employed a connecting member between wiring films 22 in which an upper end portion and a lower end portion of each bump 14 are respectively projected from an upper surface and a lower surface of a second resin film 18, and two pieces of laminate members in which a wiring film 73 is formed on one of surfaces of an insulating resin film 72 are provided on upper and lower surfaces of the member 22. Thus, the multilayer wiring substrate having wiring films 73 on both surfaces thereof is obtained.

A. As shown in FIG. 24(A), there is prepared a laminate member in which the metal foil 73, which serves as the wiring film and is made of, for example, copper or the like, is formed on the sheet 72 (which may be insulative or made of metal).

B. The metal foil 73 is subjected to patterning through selective etching, to thereby form the wiring film 73 (FIG. 24(B)) Thus, a one-sided wiring substrate 74 on which the wiring film 73 is formed on only one of the surfaces is obtained.

C. Then, as shown in FIG. 24(C), the connecting member between wiring films 22 in which the upper end portion and the lower end portion of each bump 14 are projected from the upper surface and the lower surface of the second resin film 18 is, and two pieces of one-sided wiring substrates 74 obtained in the manner shown in FIGS. 24(A) and 24(B) are prepared. The one-sided wiring substrates 74 are faced to both surfaces of the connecting member between wiring films 22 such that the wiring films 73 face the member 22 side through the alignment (alignment for establishing a predetermined positional relationship between the bumps 14 and the wiring films 73 of the one-sided wiring substrates 74).

D. Next, the connecting member between wiring films 22 and the one-sided wiring substrates 74 are integrated by the room-temperature compression bonding or thermo-compression bonding. Then, there is obtained a multilayer wiring substrate having the wiring films 73 on both surfaces thereof, in which the surface of the wiring film 73 of each of the one-sided wiring substrates 74 and the surface of the second resin film 18 are integrated to be located on the same plane, that is, in which the wiring film 73 is embedded so as to be located on the same plane as the surface of the resin film 18. Thereafter, the sheets 72 on both upper and lower sides are separated to be removed. FIG. 24(D) shows the state after the separation.

The multilayer wiring substrate having the double-sided wirings, as shown in FIG. 24(D), has no unevenness on both the surfaces having the wiring films 73. That is, the multilayer wiring substrate is flat, in which the warping is not easily caused. A solder resist film is easily formed, and the defect of the solder resist film is hard to be generated. Thus, the preferable solder resist film can be formed.

Also, in the case where other wiring substrate or plural wiring substrates are laminated on the above multilayer wiring substrate to thereby obtain the multilayer wiring substrate having the larger number of layers, the use of the multilayer wiring substrate with both flat surfaces enables easy lamination. This becomes a factor for enhancing the reliability and quality.

15) Embodiment 15

FIGS. 25(A) to 25(C) show Embodiment 15, showing a method of manufacturing a multilayer wiring substrate in order of manufacturing step. According to Embodiment 15, a multilayer wiring substrate having through holes is prepared as a wiring substrate to be a core component, and on both surfaces thereof, connecting members between wiring films having bumps are laminated. Then, metal foils on surfaces of the connecting members are subjected to selective etching, to thereby form wiring films.

A. As shown in FIG. 25(A), there are prepared a multilayer wiring substrate 75 which has through holes and which serves as a core component and two pieces of connecting members between wiring films 22 and two pieces of metal foils 23 that serve as wiring films which are shown in FIG. 1(G). The alignment of the connecting members between wiring films 22 is performed such that both surfaces of the multilayer wiring substrate 75 serving as the core component are faced thereto. Further, the metal foils 23 are faced toward the connecting members between wiring films 22 from the outside thereof.

Here, description will be made of the wiring substrate 75 serving as the core component. Reference numeral 77 denotes an insulating substrate; reference numeral 78 denotes through holes formed in the insulating substrate 77; and reference numeral 79 denotes connecting wiring films between upper wiring and lower wiring, which are formed on surfaces of the through holes 78. For example, the wiring film 79 consists of a plated film, and can be formed by a technique known as a so-called through hole forming technique or via hole forming technique.

B. The multilayer wiring substrate 75 having through holes which serves as the core component, two pieces of the connecting members between wiring films 22, and two pieces of the metal foils 23 that serve as the wiring films are then subjected to the room-temperature compression bonding or thermo-compression bonding, to thereby achieve their integration as shown in FIG. 25(B).

C. The upper and lower metal foils 23 are subjected to photo etching, thereby forming the wiring films as shown in FIG. 25(C). Thus, a four-layer wiring substrate is completed.

According to Embodiment 15, the multilayer wiring substrate 75, which is manufactured by the conventional general method and can sufficiently secure the mechanical intensity, is employed as the core component, and a multilayer wiring technique that uses the connecting members between wiring films 22 is applied thereto, whereby the multilayer wiring substrate, which is thick and has high intensity, can be obtained.

According to the connecting member between wiring films of the first aspect of the present invention, the multilayer wiring substrate can be manufactured by employing a normal copper foil, which is a general-purpose component and not expensive, or the like as the material, and thus, the manufacturing cost can be reduced. The formation of the bumps is sufficiently achieved by conducting etching once, thereby attaining the reduction of the number of steps, the reduction of the kinds of etching liquid, etc. In addition, a necessary number of layers can be laminated and pressed collectively at a time, by which the reduction of the number of steps is led.

According to the connecting member between wiring films of the second aspect of the present invention, the insulating film for interlayer insulation is comprised of a resin layer with a three-layer structure in which thermo-compression bonding resin is provided to both surfaces of a core member made of resin. Accordingly, the adherence between the wiring film forming metal foil and the insulating film is secured, thereby being capable of increasing the reliability.

The method of manufacturing a connecting member between wiring films of the third aspect of the present invention includes:

laminating a carrier layer on a bump forming metal layer;

forming resist patterns to an opposite surface of the bump forming metal layer to the surface on which the carrier layer is laminated;

performing etching to the bump forming metal layer with the resist patterns serving as a mask to form a first member in which a plurality of bumps, which are formed approximately in a cone-shape, are projected from the carrier layer;

laminating an insulating film on the first member so as to make top portions of the bumps be exposed from the insulating film to form a second member; and removing the carrier layer from the second member to form a connecting member between wiring films in which the bumps formed approximately in a cone-shape are embedded in the insulating film such that at least one ends of the bumps are projected therefrom. Thus, a connecting member between wiring film can be manufactured by using the member according to the first or second aspect of the present invention. Accordingly, the wiring substrate having wiring films on both surfaces thereof can be manufactured by using a normal copper foil, which is not expensive as a general-purpose component, or the like as a material, and therefore, the manufacturing cost can also be suppressed low.

The method of manufacturing a multilayer wiring substrate of the fourth aspect of the present invention includes:

arranging copper foils that serve as wiring films above and under a connecting member between wiring films having a plurality of bumps which are formed approximately in a cone-shape and which are embedded in an insulating film such that at least one ends of the bumps are projected therefrom; and integrating the insulating film and the copper foils through thermal pressing. Accordingly, the wiring substrate having wiring films on both surfaces thereof can be manufactured by using a normal copper foil, which is not expensive as a general-purpose component, or the like as a material, and therefore, the manufacturing cost can also be suppressed low.

The method of manufacturing a multilayer wiring substrate of the fifth aspect of the present invention includes:

arranging members in which a metal foil is previously attached to a carrier and predetermined patterning is conducted thereto above and under a connecting member between wiring films having an insulating film for interlayer insulation and bumps; and integrating the insulating film, the bumps, the carrier, and the metal foil through thermal pressing. Accordingly, the wiring substrate having wiring films on both surfaces thereof can be manufactured by using a normal copper foil, which is not expensive as a general-purpose component, or the like as a material, and therefore, the manufacturing cost can also be suppressed low.

The method of manufacturing a multilayer wiring substrate of the sixth aspect of the present invention includes connecting wiring films of a double-sided wiring substrate or multilayer wiring substrate with wiring films of other double-sided wiring substrate or multilayer wiring substrate by a plurality of bumps which are formed approximately in a cone-shape and which are embedded in an insulating film such that at least one ends of the bumps are projected therefrom. Accordingly, the wiring substrate having wiring films on both surfaces thereof can be manufactured by using a normal copper foil, which is not expensive as a general-purpose component, or the like as a material, and therefore, the manufacturing cost can also be suppressed low.

The method of manufacturing a multilayer wiring substrate of the seventh aspect of the present invention includes:

laminating an insulating film for interlayer insulation on one of principal surfaces of a carrier which is formed with a plurality of bumps formed approximately in a cone-shape so as to make the insulating film be penetrated with the bumps;

laminating a wiring film forming metal foil on an opposite surface of the insulating film to the carrier;

removing the carrier; and laminating other wiring film forming metal foil on the surface from which the carrier is removed to integrate the bumps, the insulating film, and the two wiring film forming metal foils. Accordingly, the wiring substrate having wiring films on both surfaces thereof can be manufactured by using a normal copper foil, which is not expensive as a general-purpose component, or the like as a material, and therefore, the manufacturing cost can also be suppressed low.

Then, the lamination of the two wiring film forming metal foils are performed by conducting different pressing processes twice, and thus, the mutual positional relationship of the bumps can be regulated by two members, that is, the insulating film for interlayer insulation and the carrier to achieve integration with the wiring film forming metal foil, in the first lamination of one of the metal foils. Therefore, the deviation of the mutual positional relationship between the bumps can be made extremely small.

Further, the lamination with pressing of the other wiring film forming metal foil is conducted in the state where the mutual positional relationship between the bumps is regulated by the wiring film forming metal foil, and thus, the wiring substrate can be formed while high precision on the positional relationship is maintained.

The method of manufacturing a multilayer wiring substrate of the eighth aspect of the present invention includes:

preparing a carrier which serves as an interlayer insulating film and which is formed with a plurality of bumps formed approximately in a cone-shape on one of principal surfaces thereof;

obtaining the state where the bumps penetrate the carrier; and laminating wiring film forming metal foils on both the surfaces of the carrier to attain the integration. Accordingly, the wiring substrate having wiring films on both surfaces thereof can be manufactured by using a normal copper foil, which is not expensive as a general-purpose component, or the like as a material, and therefore, the manufacturing cost can also be suppressed low.

Further, the carrier is used as it is as the interlayer insulating film. Therefore, a waste of the carrier can be avoided, and further, reduction of the material cost can be attained.

According to the method of manufacturing a multilayer wiring substrate of the ninth aspect of the present invention, the wiring substrate having wiring films on both surfaces thereof can be manufactured by using a normal copper foil, which is not expensive as a general-purpose component, or the like as a material. In addition, the bump corresponding holes are previously formed in the insulating film for interlayer insulation which is laminated on the member in which the bumps are formed on the wiring film forming metal foil so as to correspond to the bumps. Thus, in the lamination of the insulating film, the insulating film is smoothly penetrated with the bumps, and the contamination due to foreign particle and matter which derive from the insulating film forming material and which are generated through the penetration can further be reduced.

According to the method of manufacturing a multilayer wiring substrate of the tenth aspect of the present invention, the wiring substrate having wiring films on both surfaces thereof can be manufactured by using a normal copper foil, which is not expensive as a general-purpose component, or the like as a material. In addition, the insulating film for interlayer insulation is pressed to be laminated on the wiring film forming metal foil formed with the bumps through the mold formed with the bump corresponding holes in the state where the bump corresponding holes and the bumps are aligned with each other. Thus, in the lamination of the insulating film, the insulating film is sharply penetrated with the mold having the bump corresponding holes and the bumps. Accordingly, the foreign particles and matters which derive from the insulating film forming material and which are generated through the penetration can be reduced, and therefore, the contamination can further be reduced.

According to the method of manufacturing a multilayer wiring substrate of the eleventh aspect of the present invention, in the method of manufacturing a multilayer wiring substrate of the tenth aspect of the invention, the mold adhered with the resin film with adhesive by the adhesive on its opposite surface to the insulating film is used as the mold formed with the bump corresponding holes, and the mold having the bump corresponding holes is removed through the adhesive by peeling the resin film. Therefore, the mold can be removed together with the foreign particle that is generated through the penetration by removing the resin film. Accordingly, the foreign particles and matters can be reduced, and therefore, the contamination can further be reduced.

According to the method of manufacturing a multilayer wiring substrate of the twelfth aspect of the present invention, the bump can be heightened without being limited in vain as to heightening of the arrangement density. That is, selective etching generally involves side etching, and the amount of side etching is substantially proportional to the depth of etching. Therefore, as the wiring substrate with higher bumps is to be obtained, the amount of side etching becomes larger. In addition, the integration density becomes lower.

However, according to the method of manufacturing a multilayer wiring substrate of the present invention, the half bumps are formed by performing half etching from both the surfaces of the thick bump forming copper foil (half etching at the same time or different times), and the bumps are formed by combining the two half bumps. Accordingly, the high bumps can be formed with a little amount of side etching.

According to the method of manufacturing a multilayer wiring substrate of the thirteenth aspect of the present invention, the surface of the wiring film and the surface of the insulating film that serves as the base film can be located on the same plane through pressing for integration. As a result, deformation such as warping is difficult to be developed, and the reliability is enhanced. Accordingly, the lamination for a large number of multilayer wiring substrates is easily performed, and thus, the multilayer lamination is performed with more ease.

According to the method of manufacturing a connecting member between wiring films of the fourteenth aspect of the present invention, the wiring substrate having wiring films on both surfaces thereof can be manufactured by using a normal copper foil, which is not expensive as a general-purpose component, or the like as a material, and therefore, the manufacturing cost can also be suppressed low. In addition, there is obtained such an effect that the bumps can be arranged with the pitch smaller than the limitation pitch of the etching resist pattern.

According to the method of manufacturing a multilayer wiring substrate of the fifteenth aspect of the present invention, the wiring substrate having wiring films on both surfaces thereof can be manufactured by using a normal copper foil, which is not expensive as a general-purpose component, or the like as a material, and therefore, the manufacturing cost can also be suppressed low. In addition, there is obtained such an effect that the fine wiring patterns, which are characteristic of the semi-additive process, can be formed on both sides of the insulating film.

According to the connecting member between wiring films of the sixteenth aspect of the present invention, there is obtained such an effect that the fine pitch can be maintained even when the bump is heightened.

What is claimed is:

1. A method of manufacturing a multilayer substrate having exposed metal films on exterior surfaces thereof, comprising:
    providing a metal layer;
    etching the metal layer to form conductive bumps;
    assembling the etched conductive bumps with an insulating film having a first major surface and a second major surface remote from the first major surface, the metal bumps having first ends at least exposed at the first major surface and second ends at least exposed at the second major surface;
    arranging a substantially continuous first metal sheet adjacent to the first major surface of the insulating film and the first ends of the metal bumps;
    arranging a substantially continuous second metal sheet adjacent to the second major surface of the insulating film and the second ends of the metal bumps; and
    applying at least pressure in a direction between the first and second metal sheets to simultaneously metallically bond the first and second metal sheets directly to the metal bumps.

2. The method as claimed in claim 1, wherein the metal bumps consist essentially of copper and the first and second metal sheets consist essentially of copper.

3. The method as claimed in claim 1, wherein the metal bumps have cone shape.

4. The method as claimed in claim 1, further comprising patterning at least one of the first metal sheet or second metal sheet into wiring patterns after the first and second metal sheets are bonded to the metal bumps.

5. The method as claimed in claim 1, wherein, prior to the first and second metal sheets being bonded to the metal bumps, at least second ends of the bumps protrude from the insulating film beyond the second major surface.

6. The method as claimed in claim 5, wherein each of the metal bumps has a base and an end remote from the base, wherein, prior to the first and second metal sheets being bonded to the bumps, the bases of the metal bumps are exposed at the first major surface and the ends of the metal bumps protrude beyond the second major surface.

7. The method as claimed in claim 5, wherein each of the metal bumps has a base and an end remote from the base, wherein, prior to the first and second metal sheets being bonded to the metal bumps, the ends of the metal bumps are exposed at the second major surface and the bases of the metal bumps protrude beyond the first major surface.

8. The method as claimed in claim 5, wherein each of the metal bumps has a base and an end remote from the base, wherein, prior to the first and second metal sheets being bonded to the metal bumps, the ends of some of the metal bumps are at least exposed at the first major surface and the ends of some others of the metal bumps are at least exposed at second major surface.

* * * * *

UNITED STATES PATENT AND TRADEMARK OFFICE
CERTIFICATE OF CORRECTION

| | |
|---|---|
| PATENT NO. | : 7,238,603 B2 |
| APPLICATION NO. | : 11/029423 |
| DATED | : July 3, 2007 |
| INVENTOR(S) | : Tomoo Ijima and Kimitaka Endo |

Page 1 of 1

It is certified that error appears in the above-identified patent and that said Letters Patent is hereby corrected as shown below:

Column 5, line 2 delete "in the tenth aspect of the invention,".
Column 25, line 11 "are" should read --is--.

Signed and Sealed this

Twenty-seventh Day of May, 2008

JON W. DUDAS
*Director of the United States Patent and Trademark Office*